United States Patent [19]
Brown et al.

[11] Patent Number: 6,100,013
[45] Date of Patent: *Aug. 8, 2000

[54] METHOD FOR FORMING TRANSISTORS WITH RAISED SOURCE AND DRAINS AND DEVICE FORMED THEREBY

[75] Inventors: Jeffery S. Brown, Middlesex; James S. Dunn, Jericho; Steven J. Holmes, Milton; David V. Horak, Essex Junction; Robert K. Leidy, Burlington; Steven H. Voldman, South Burlington, all of Vt.

[73] Assignee: International Business Machines Corporation, Armonk, N.Y.

[*] Notice: This patent is subject to a terminal disclaimer.

[21] Appl. No.: 09/071,207

[22] Filed: May 1, 1998

Related U.S. Application Data

[63] Continuation-in-part of application No. 08/895,749, Jul. 17, 1997, Pat. No. 5,981,148.

[51] Int. Cl.[7] .................................................. G03F 7/20
[52] U.S. Cl. .................... 430/312; 430/314; 430/317; 438/303; 216/46
[58] Field of Search .................................. 430/312, 313, 430/314, 316, 317, 394; 438/303; 216/46

[56] References Cited

U.S. PATENT DOCUMENTS

| | | | |
|---|---|---|---|
| 4,016,587 | 4/1977 | De La Moneda | 357/23 |
| 4,072,545 | 2/1978 | De La Moneda | 148/187 |
| 4,404,732 | 9/1983 | Andrade | 29/571 |
| 4,688,314 | 8/1987 | Weinberg et al. | 437/56 |
| 4,997,746 | 3/1991 | Greco et al. | 430/314 |
| 4,998,150 | 3/1991 | Rodder et al. | 357/23.1 |
| 5,079,180 | 1/1992 | Rodder et al. | 437/44 |
| 5,198,378 | 3/1993 | Rodder et al. | 437/41 |
| 5,213,990 | 5/1993 | Rodder | 437/40 |
| 5,243,255 | 9/1993 | Iwasaki | 313/478 |
| 5,244,759 | 9/1993 | Pierrat | 430/5 |
| 5,275,896 | 1/1994 | Garofalo et al. | 430/5 |
| 5,308,721 | 5/1994 | Garofalo et al. | 430/5 |
| 5,312,768 | 5/1994 | Gonzalez | 437/40 |
| 5,381,028 | 1/1995 | Iwasa | 257/316 |
| 5,405,795 | 4/1995 | Beyer et al. | 437/41 |
| 5,409,853 | 4/1995 | Yu | 437/41 |
| 5,436,178 | 7/1995 | Kimura | 437/30 |
| 5,464,782 | 11/1995 | Koh | 437/41 |
| 5,486,449 | 1/1996 | Hosono et al. | 430/328 |
| 5,496,750 | 3/1996 | Moslehi | 437/41 |
| 5,573,964 | 11/1996 | Hsu et al. | 437/40 |
| 5,610,099 | 3/1997 | Stevens et al. | 437/192 |
| 5,741,624 | 4/1998 | Jeng et al. | 430/312 |
| 5,981,148 | 11/1999 | Brown | 430/314 |

*Primary Examiner*—Kathleen Duda
*Attorney, Agent, or Firm*—Schmeiser, Olsen & Watts; Eugene I. Shkurko

[57] ABSTRACT

The preferred embodiment of the present invention provides a transistor structure and method for fabricating the same that overcomes the disadvantages of the prior art. In particular, the preferred structure and method results in lower leakage and junction capacitance by using raised source and drains which are partially isolated from the substrate by a dielectric layer. The raised source and drains are preferably fabricated from the same material layer used to form the transistor gate. The preferred method for fabricating the transistor uses hybrid resist to accurately pattern the gate material layer into regions for the gate, the source and the drain. The source and drain regions are then connected to the substrate by growing silicon. The preferred method thus results in an improved transistor structure while not requiring excessive fabrication steps.

20 Claims, 31 Drawing Sheets

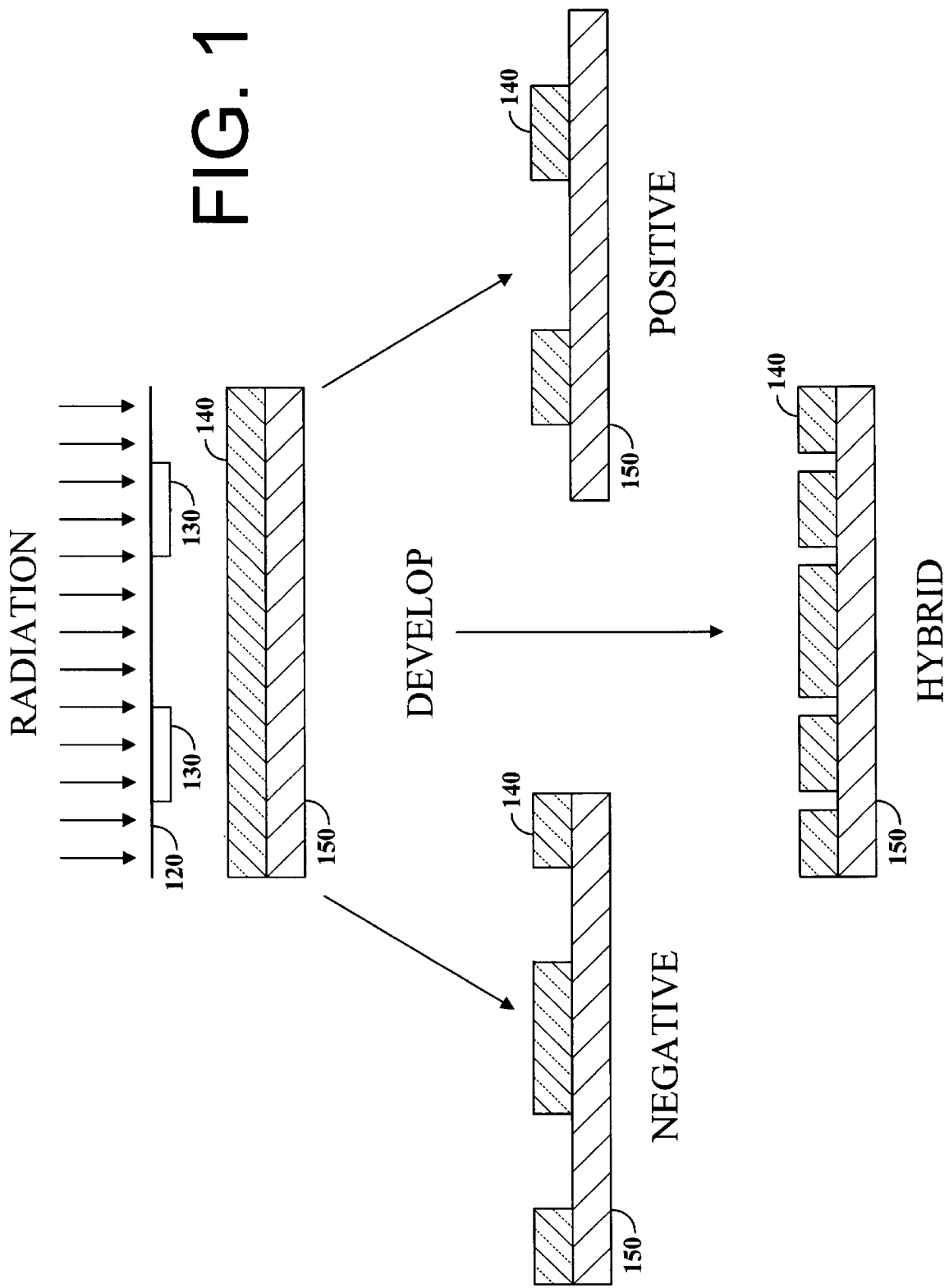

METHOD FOR FORMING TRANSISTORS WITH RAISED SOURCE AND DRAINS AND DEVICE FORMED THEREBY

RELATED APPLICATIONS

This application is a continuation-in-part of "Method for Forming Sidewall Spacers Using Frequency Doubling Hybrid Resist and Device Formed Thereby", Ser. No. 08/895,749, Docket No. BU-9-97-036, filed on Jul. 17, 1997; now U.S. Pat. No. 5,981,148, and is related to the following U.S. Patent applications: "Method of Photolithographically Defining Three Regions with One Mask Step and Self-Aligned Isolation Structure Formed Thereby," Ser. No. 08/895,748, Docket No. BU9-96-149, filed on Jul. 17, 1997; "Low 'K' Factor Hybrid Photoresist," Ser. No. 08/715,288, Docket No. F19-96-055; and "Frequency Doubling Photoresist," Ser. No. 08/715,287, Docket No. BU9-96-047, both filed Sep. 16, 1996.

BACKGROUND OF THE INVENTION

1. Technical Field

The present invention relates generally to the field of semi-conductor manufacturing and, more specifically, to a method for forming transistors with raised source and drains.

2. Background Art

The need to remain cost and performance competitive in the production of semiconductor devices has caused continually increasing device density in integrated circuits. To facilitate the increase in device density, new technologies are constantly needed to allow the feature size of these semiconductor devices to be reduced.

The push for ever increasing device densities is particularly strong in CMOS technologies, such as the in the design and fabrication of field effect transistors (FETs). FETs are used in almost all types of integrated circuit design (i.e., microprocessors, memory, etc.)

One problem with traditional CMOS FET designs is the propensity for these devices to "latch-up." Latch-up is a well known problem caused by unwanted transistor action between elements of the integrated circuit. This unwanted transistor action can be triggered by a wide variety of events, and can cause the semiconductor device to fail.

Latch-up is generally caused by the close proximity of n-channel and p-channel devices in modern CMOS devices. For example, a typical CMOS device fabricated on a p-type substrate would contain a p-channel device fabricated in a n-well (or n-type region) and an n-channel device fabricated in a p-well (or p-type region), with only a short distance between the wells. This structure inherently forms a parasitic lateral bipolar structure (npn) and parasitic vertical bipolar structure (pnp). Under certain biasing conditions the pnp structure can supply base current to the npn structure (or vice versa), causing a large current to flow from one well to the other well. This large current can damage the CMOS device.

The propensity for CMOS devices to latch-up has been addressed in several ways. One way involves reducing the "gain" or beta of the transistor (npn and pnp). This generally reduces the propensity of the CMOS device to latch-up by increasing the trigger voltage/current, where the trigger voltage/current is the voltage/current that must be applied to a node to induce latch-up.

Shallow trench isolation (STI) has been used between the n-channel and p-channel devices to minimize the likelihood of latch-up. However, as device density continues to increase the STI depth tends to decrease. This causes the latch-up holding voltage to be reduced. If the latch-up holding voltage and trigger voltage/current is reduced significantly, i.e., to less than the burn-in voltage, the reliability of the device can be negatively impacted.

One of the bedrock technologies that has allowed FETs to be widely used is the use of gate sidewall spacers. Typical sidewall spacers are formed using a conformal deposition of a spacer material over the gate structure, followed by a directional etch, as disclosed in Pogge, U.S. Pat. No. 4,256,514, "Method for Forming a Narrow Dimensioned Region on a Body," assigned to International Business Machines, Inc. The directional etch removes all the spacer material from the horizontal surfaces, but leaves "spacers" at the sidewalls of the gates. These spacers are inherently self-aligned with the gate.

Unfortunately, the sidewall spacer has a limited ability to be scaled to smaller dimensions. For example, in traditional methods of creating a sidewall spacers is that the process for forming spacers results in spacers on all exposed sidewalls of a structure. If a spacer is not desired on a particular sidewall, it must be removed with additional processing steps. These additional processing steps are not self aligned, and thus result in additional unwanted process variations.

Thus, there is a need for improved methods of increasing latch-up immunity of CMOS devices, and a need for methods to form source/drain regions with lower leakage and junction capacitance, and integratable with standard processes and structures. There is an additional need for improved methods of forming sidewall spacers that are used in these CMOS devices.

DISCLOSURE OF INVENTION

Accordingly, the present invention uses a novel method of forming sidewall spacers which is utilized to provide a transistor structure and method for fabricating the same that overcomes the disadvantages of the prior art. In particular, the preferred structure and method results in lower leakage and junction capacitance by using raised sources and drains which are partially isolated from the substrate by a dielectric layer. The raised source and drains are preferably fabricated from the same material layer used to form the transistor gate. The preferred method for fabricating the transistor uses hybrid resist to accurately pattern the gate material layer into regions for the gate, the source and the drain. The source and drain regions are then connected to the substrate by growing silicon. The preferred method thus results in an improved transistor structure while not requiring excessive fabrication steps.

The foregoing and other advantages and features of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and FIG. 1 is a schematic diagram showing the use of the hybrid resist;

BEST MODE FOR CARRYING OUT THE INVENTION

Figure 3:
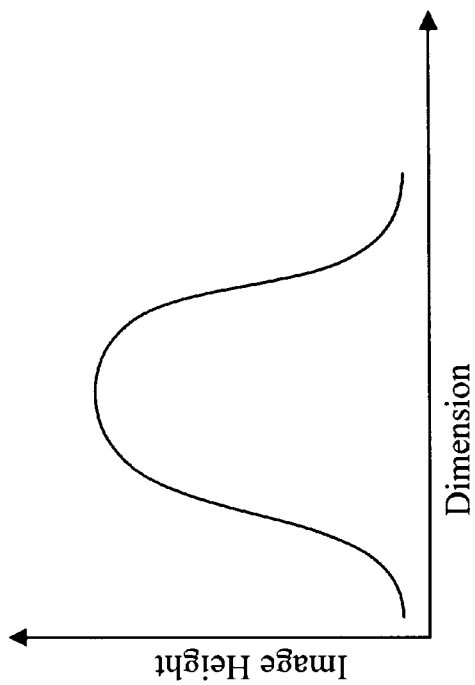
FIG. 3 is a graph illustrating the line pattern for positive resist printed with a reticle line pattern.

The preferred embodiment of the present invention overcomes the limitations of the prior art and provides a method to form selectively sidewall spacers on the sides of features in a self aligned manner. The preferred embodiment uses this sidewall spacer method to facilitate the formation of field effect transistors with raised source and drain regions that increase the performance of the transistor. The preferred embodiment uses hybrid resist which exhibits both positive and negative tone responses as well as an intermediate response to define and form the sidewall spacer regions. A description of hybrid resist will now be given, followed by a description of the preferred embodiments.

Hybrid Photoresist

The preferred embodiment uses photoresist material having, simultaneously, both a positive tone and a negative tone response to exposure. This combination of materials can provide a new type of resist, which we call a hybrid resist.

As a hybrid resist is exposed with actinic radiation, areas exposed with high intensity radiation form a negative tone line pattern. Areas which are unexposed remain insoluble in developer, thus forming a positive tone line pattern. Areas which are exposed with intermediate amounts of intensity, such as the edges of the aerial image where diffraction effects have reduced the intensity, form a space in the resist film during develop. This resist response is an expression of the unique dissolution rate properties of this resist, in which unexposed resist does not develop, partially exposed resist develops at a high rate, and highly exposed resist does not develop.

The unique dissolution rate response of the hybrid photoresist allows a single aerial image to be printed as a space/line/space combination rather than as a single line or space, as with conventional resist. This 'frequency doubling' capability of this resist allows conventional expose systems to be extended to higher pattern densities. It is an advantage of one example of hybrid resist that lines and spaces of 0.2 $\mu$m and less can be printed with current deep ultra violet (DUV) lithography tools that are designed for operation at 0.35 $\mu$m resolution.

It is a further advantage of this type of hybrid resist that the space width is generally unchanging as the exposure dose and the reticle image size are changed. This allows very precise image control for the space width within each chip, across each wafer, and from one batch of product wafers to the next.

Still another advantage the hybrid resist is the relaxation of the minimum reticle feature size due to the frequency doubling capability of hybrid resist. For example, to print a 0.2 $\mu$m feature with conventional resist generally requires a 0.2 $\mu$m reticle image size. With hybrid resist, a 0.2 $\mu$m space can be formed with a single edge of a reticle feature; for example, a 0.5 $\mu$m reticle opening could produce two 0.2 $\mu$m spaces and a 0.2 $\mu$m line. In this way, one could accomplish 'reduction' x-ray or E-beam lithography; the reticle image pitch could be approximately 2x the printed pitch on the substrate. This also has the additional advantage of allowing a relaxation of the image size requirements of optical reticles, reducing cost and improving yield of the reticle. It is an advantage of hybrid resist that lines and spaces of 0.2 $\mu$m and less may be achieved without altering the present tools.

It is a further advantage that the space width is generally unchanging as the exposure dose and reticle sizes change, thereby allowing greater process latitude for control of space width. Through the use of the hybrid resist of the present invention, errors in the image dimension on the reticle are not reproduced in the space width printed on the substrate. As a result, the across-chip space width variation is minimized. This is valuable for optical, X-ray and e-beam exposure methods. It is especially useful in lithographic techniques that require a 1× reticle, i.e., a reticle that normally has a one-to-one relationship with the image printed on the substrate, because variations in the image size on the reticle are normally reproduced on the substrate.

Figure 2:
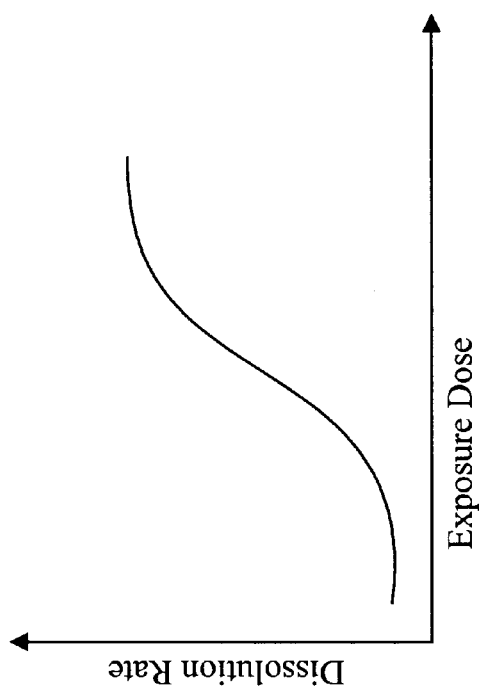
FIG. 2 is a graph is illustrating how positive resist undergoes an increase in solubility as the exposure dose is increased.

Accordingly, the preferred embodiment hybrid resist provides a photoresist material having, simultaneously, both a positive tone and a negative tone response to exposure. The positive tone response dominates at the lower exposure dose while the negative response predominates at the higher exposure dosages. Exposure of this resist creates a space/line/space combination, whereas either of the conventional resists would produce only a single feature. Turning to FIG. 2, a graph is illustrated showing how positive resist undergoes an increase in solubility as the exposure dose is increased. Turning to FIG. 3, the line pattern for positive resist printed with a reticle line pattern is illustrated.

Figure 5:
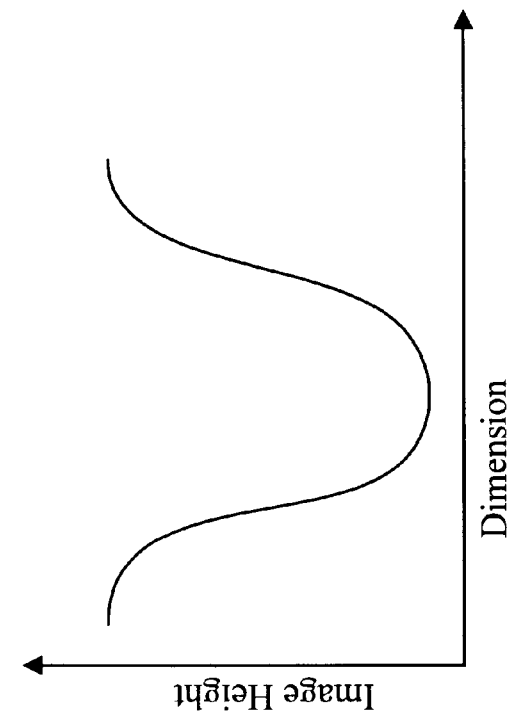
FIG. 5 is a graph illustrating the line pattern for negative resist printed with a reticle line pattern.
Figure 4:
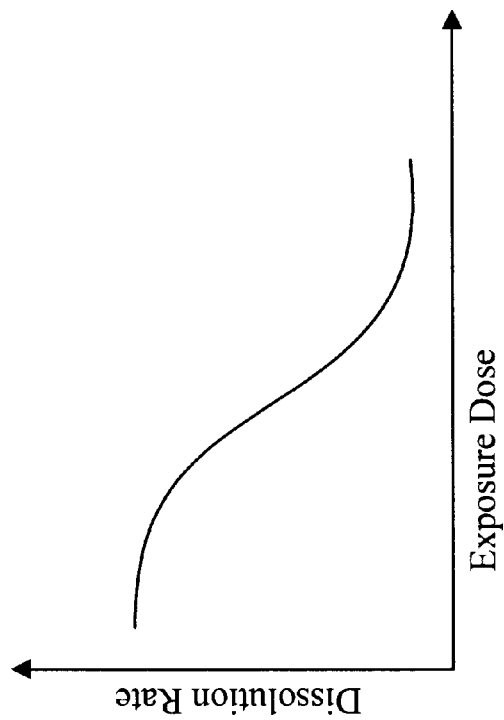
FIG. 4 is a graph illustrating how in negative resist systems exposed areas undergo a reduction in solubility as the exposure dose is increased.

On the other hand, in the negative resist system exposed areas undergo a reduction in solubility as the exposure dose is increased, as illustrated in FIG. 4. Turning to FIG. 5, the line pattern for negative resist printed with a reticle line pattern is illustrated.

Figure 7:
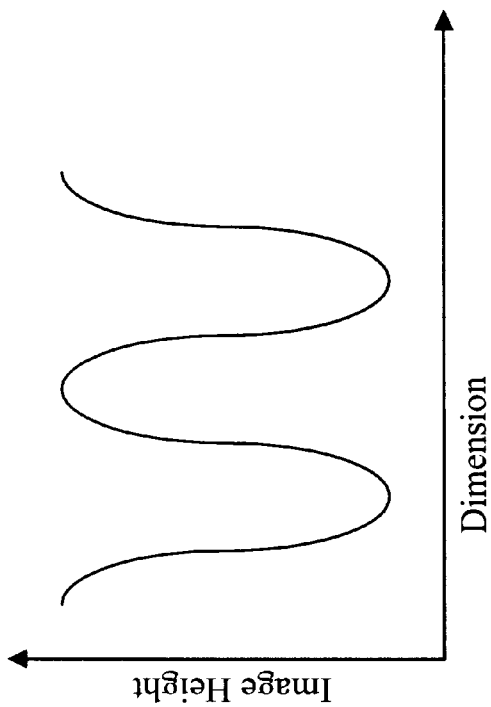
FIG. 7 is a graph illustrating the space/line/space pattern formed onto a substrate using hybrid resist.
Figure 6:
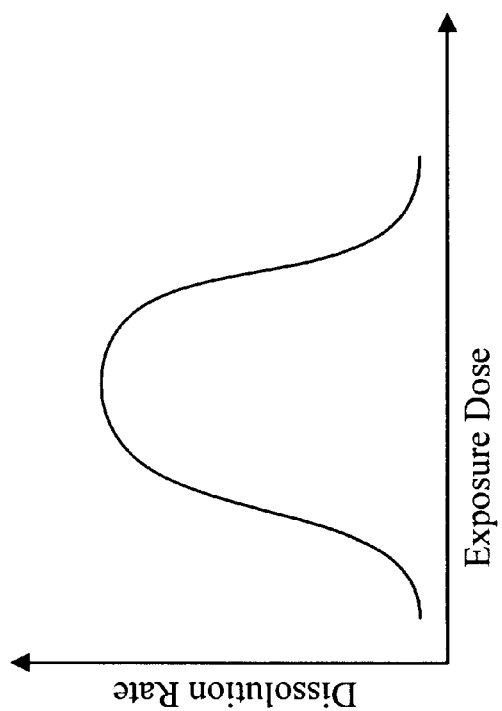
FIG. 6 is a graph of the resist solubility as a function of exposure dose for hybrid resist.

For the hybrid resist of the present invention, the positive tone response causes an increase in solubility in the areas where diffraction effects have reduced the expose intensity, such as the areas near the edge of the reticle image. As the exposure dose is increased, the negative tone response predominates, causing a reduction in solubility in the more highly exposed areas. Turning to FIG. 6, the graph of the resist solubility as a function of exposure dose for hybrid resist is illustrated. Printing a reticle line pattern onto a substrate results in the space/line/space pattern illustrated in FIG. 7.

In this manner, the aerial image is "frequency doubled" to produce twice the number of features than would otherwise be attainable with the standard resist. FIG. 1 illustrates these salient differences between a positive resist, a negative resist, and a hybrid resist. In FIG. 1, a hybrid photoresist 140 has been deposited over the surface of substrate 150. A mask 120 with chrome areas 130 is used to selectively mask portions of photoresist 140 from a radiation source. After exposure, photoresist 140 is developed and portions subsequently removed by washing the surface of the wafer. Depending on the nature and composition of photoresist 140, a certain pattern, which is related to chrome areas 130 on mask 120, will be formed in photoresist 140. As shown in FIG. 1, a positive photoresist will leave areas that correspond to chrome areas 130. A negative photoresist will create a pattern whereby the areas that correspond to chrome areas 130 are removed from substrate 150. A hybrid photoresist material will leave a photoresist pattern that corresponds to removal of the photoresist material from the areas of substrate 150 that are associated with the edges of chrome areas 130.

The frequency doubling hybrid resist is typically formulated using components of existing positive and negative tone resists. This includes, for example, poly (hydroxystyrene) resins which are partially modified with acid-sensitive solubility dissolution inhibiting functionalities, a cross-linker, a photo-acid generator, and, optionally, a base additive and a photosensitizer.

The resist formulations may be varied to obtain a fast positive tone reaction and a slow negative tone reaction for optimal results. Additionally, the positive tone component can be chosen such that it is relatively insensitive to post expose bake temperatures, while the negative tone portion is chosen to be more highly sensitive to post expose bake temperatures. In this way, the relative sensitivity of the positive and negative responses can be altered with bake temperatures to provide the desired imaging results.

Figure 10:
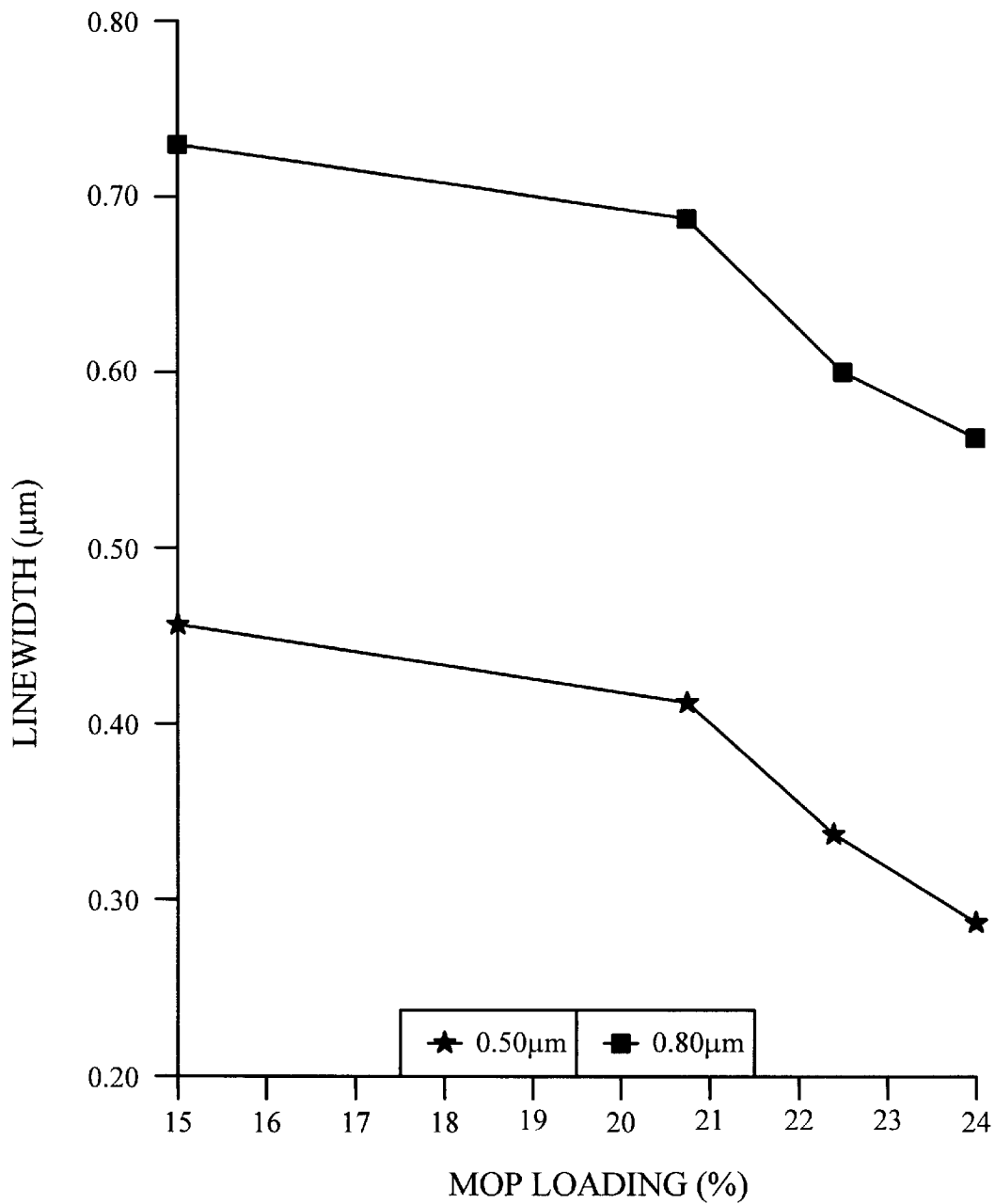
FIG. 10 is a graph showing the linewidth in nm plotted against the amount of positive tone solubility inhibitor (MOP) incorporated in a hybrid resist of the present invention.
Figure 15:
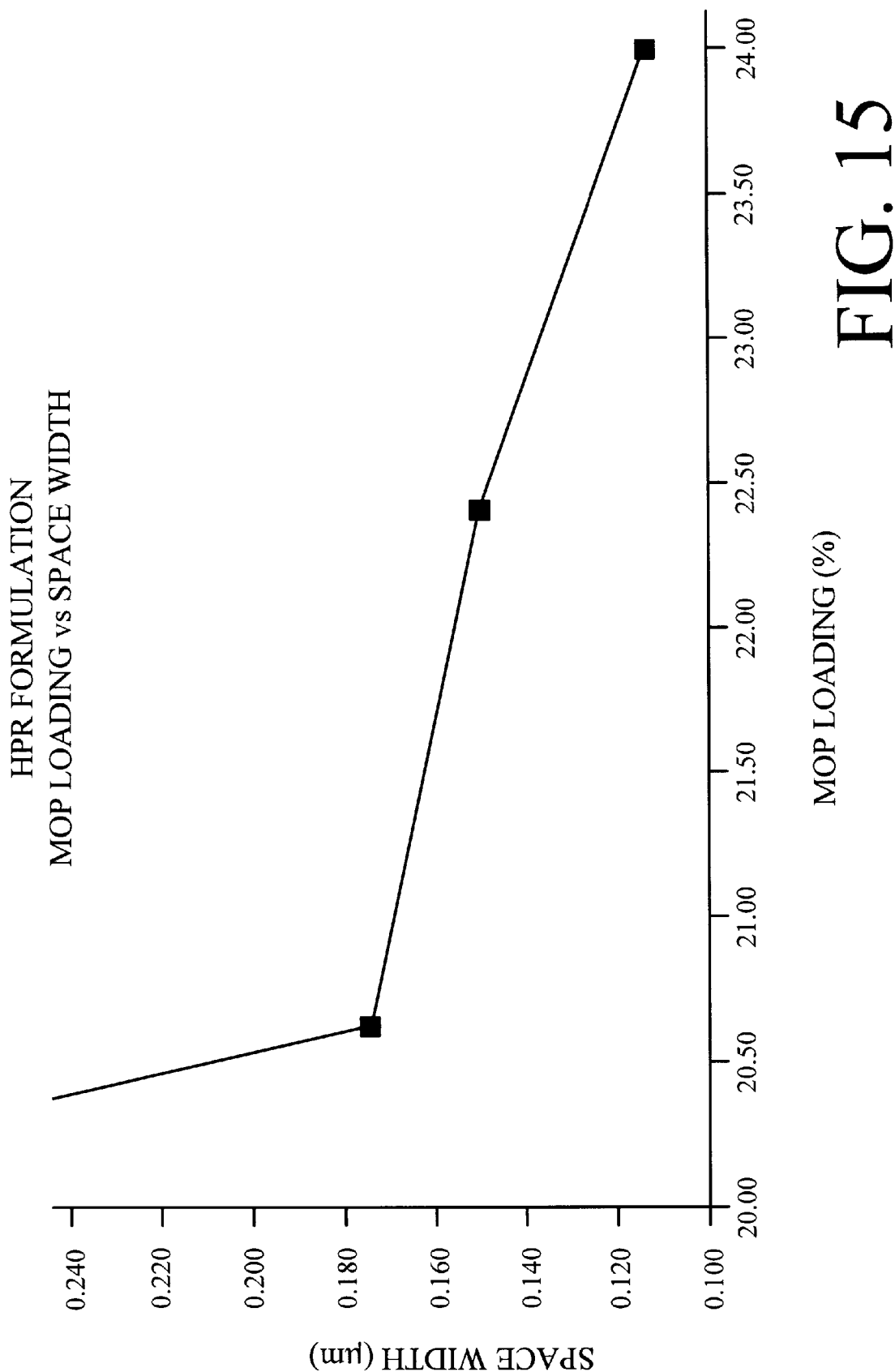
FIG. 15 is a graph showing the variation in space width in $\mu$m as a function of MOP loading using one formulation of hybrid resist of the present invention.

In addition, the resist formulations may be altered to provide space widths of different dimensions. For example, as the amount of solubility inhibitor on the poly (hydroxystyrene) resin is increased, the printed space width becomes smaller (FIG. 15). This approach may also be used to alter the isofocal print bias of the negative tone line; at higher positive tone solubility inhibitor concentrations, the isofocal print bias of the negative tone line increases (FIG. 10). This is desirable in some applications for reducing the size of the printed negative tone line, optimizing the frequency doubling characteristics of the resist.

The relative responses of the positive and negative tone functions of the hybrid resist can also be altered by modifying the exposure conditions. For example, the negative tone line of the hybrid resist does vary with exposure dose and reticle dimension, similar to the behavior of a conventional resist. Thus, as exposure dose is increased, for example, the negative tone line increases in width, and the spaces remain the same size, but the spaces are shifted to a new position on the substrate, since they lie adjacent to the negative line. Similarly, the positive tone lines alter in size as the exposure dose or reticle dimension are altered.

As another example, two reticles could be used to print two separate patterns in the resist. One reticle could be exposed with a high dose, causing the hybrid functions to be expressed in the resist. Another reticle could be exposed in the same resist film at a lower dose, causing only the positive tone function to be expressed in that portion of the resist. This effect could also be accomplished with a single expose process if, for example, the reticle contained a partial filter of the actinic radiation in the areas where a lower exposure dose was desired. This allows wider spaces to be printed at the same time as the narrower features, which is necessary in some device applications.

In a modification of this two-step imaging approach, a hybrid resist can be used to create a standard negative tone pattern. If the resist film is image-wise exposed with a standard negative tone reticle, baked to form the hybrid image, then blanket exposed with actinic radiation and developed without a second post-expose bake process, the result is a standard negative tone image. This approach may be desirable in some applications, such as the formation of gate conductor circuits, which require very small lines to be printed, but do not require a high density image pitch. As an alternative to this method, the resist may be blanket exposed to a low dose of actinic energy after the image-wise exposure and before the baking step. The desirability of the method would depend on whether a solubility inhibiting protective group is present on the resin and whether the positive tone response is temperature dependent.

Figure 8:
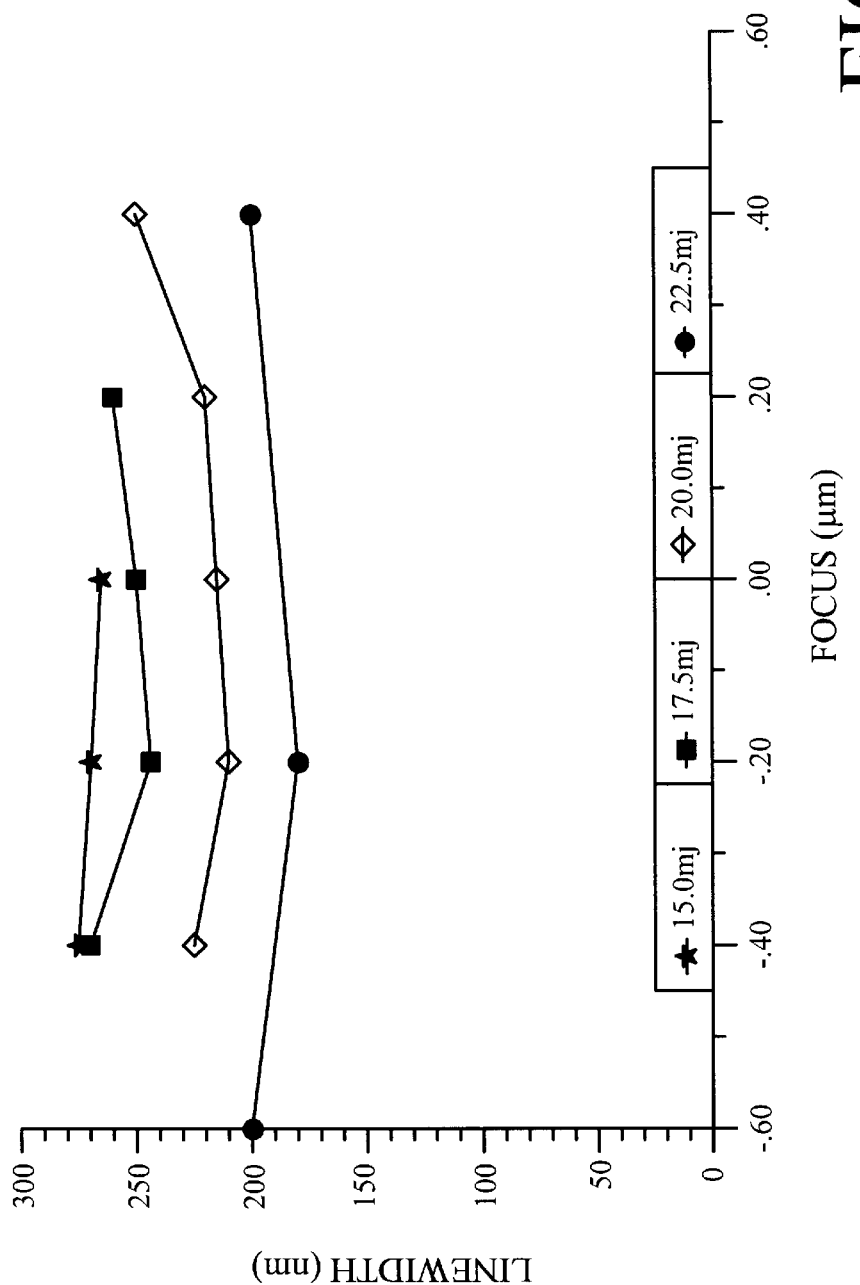
FIG. 8 is a graph of linewidth in nanometers (nm) plotted against focus in microns ($\mu$m) of a formulation of a standard negative resist at various exposure energies.
Figure 9:
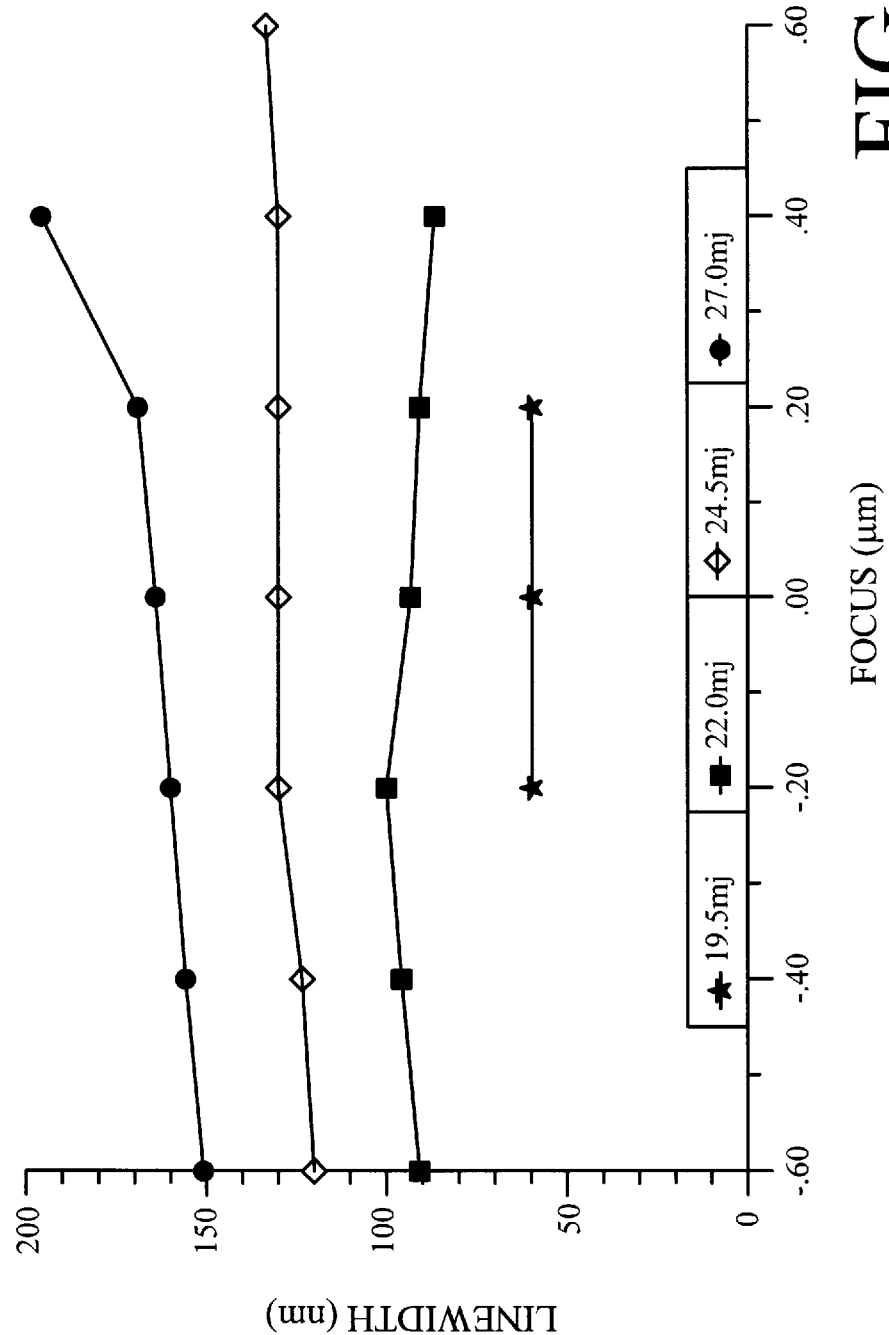
FIG. 9 is a graph of linewidth for a negative tone line of a hybrid pattern in nm plotted against focus in $\mu$m of a hybrid resist of the present invention at various exposure energies.

An advantage of using the hybrid resist in such applications is that the negative tone line of the hybrid resist can exhibit a large print bias at its isofocal point, as shown in FIG. 9. In other words, at the point of largest process latitude for the hybrid negative tone line, the resist image size can be substantially smaller than the reticle image size. This is desirable because the aerial image is less degraded by diffraction effects at the larger reticle size, thus allowing a larger depth of focus to be attained than is possible with conventional positive and negative tone systems, as shown in FIG. 8. This print bias is a result of the fact that the edge of the chrome line prints as a space. The space, in effect, acts to 'trim' the edges of the aerial image, causing the negative line to print smaller than it would with a conventional negative resist. This is an expression of the frequency doubling character of a hybrid resist.

It is possible to design the resist formulation to optimize the print bias of the negative tone line. For example, by choosing an appropriate loading factor for the positive tone solubility inhibitor, one may obtain a particular print bias as shown in FIG. 10. In theory, it is quite obvious that similar variations in the photoresist response can also be brought about by making appropriate changes in concentrations and reactivities of other components as well.

Figure 11:
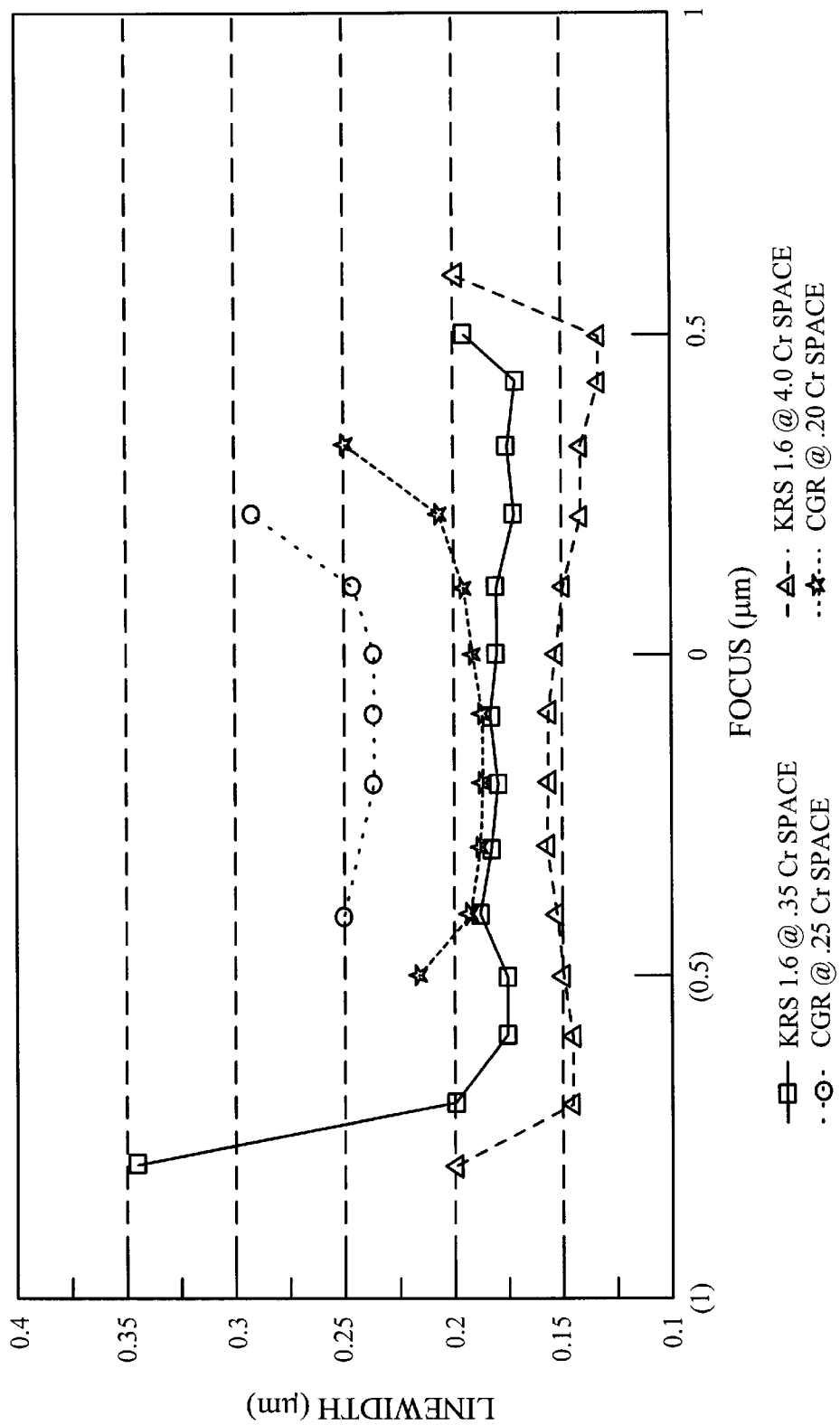
FIG. 11 is a comparative model of what the range of focus is for a given linewidth using standard resist formulations and a hybrid resist formulation of the present invention.

For example, we have found that with exposure on a DUV 0.5 NA lithography tool, the isofocal print bias for a hybrid resist can be 0.11 μm larger than the isofocal print bias for a standard negative tone resist, as exemplified in FIGS. 8 and 9 when standard calculations known in the art are performed on the data. This difference can be utilized in two ways. In one approach, the same reticle image size could be used with the hybrid resist to print a smaller line than the standard resist, while maintaining focus and exposure process latitude. In another manner of use, the size of the reticle features could be increased with the hybrid resist relative to the standard resist, while printing the same image size as the standard resist. The use of a larger reticle image provides a larger depth of focus due to reduced diffraction effects, as shown in the graph of FIG. 11. In the former application, higher performance is achieved with the smaller size of the hybrid resist. In the latter application, higher yield is achieved due to the larger process latitude of the hybrid resist.

The resist formulations may be varied to obtain a high photospeed positive tone reaction and a low photospeed negative tone reaction for optimal results. Additionally, the positive tone resist may be chosen so that it is insensitive to post expose bake (PEB) conditions so that the ratio of sensitivity of the positive tone to the negative tone function can be altered, thus changing the ratios of the space/line/space combinations.

Another option for changing the space/line/space ratios is to utilize a gray-scale filter in the reticle of the exposure tool. A gray scale filter only allows a portion of the radiation to pass through the reticle, thereby creating areas of intermediate exposure. This prevents the negative tone resist function from operating in these areas because the exposure dose would never reach the critical point, but would still allow the positive functions to occur, thereby creating wider spaces. This allows wider spaces to be printed at the same time as the narrower features, which is necessary in some device applications.

The following examples are exemplary of the frequency doubling resist composition, but are not meant to be limiting and many variations will be readily apparent to one of ordinary skill in the art.

The photoresist resins suitable for use in accordance with the invention include any of the base-soluble, long chain polymers suitable for use as a polymer resin in a photoresist formulation. Specific examples include: (i) aromatic polymers having an —OH group, e.g., polyhydroxystyrenes such as poly (4-hydroxystyrene), poly (3-hydroxystyrene), commercially available from Hoechst Celanese of Corpus Christi; Tex., novolak resins commercially available from Shipley of Marlboro, Mass.; and polymers having a phenolic —OH group, e.g, phenol formaldehyde resins; (ii) polymers having an acid group, e.g., polymethacrylic acid with an ester side chain; and (iii) acrylamide group type polymers.

The polymer resin in its deprotected form (i.e., once the positive tone reaction has occurred) is base soluble and compatible with developer solutions, such as aqueous solutions of metal-free ammonium hydroxide, tetramethylammonium hydroxide, and tetraethyl ammonium hydroxide, metal containing potassium hydroxide, and sodium metasilicate. Preferred polymer resins have an average molecular weight within the range of about 1,000 daltons to about 250,000 daltons, and most preferably within the range of about 1,000 to 25,000 daltons, to enhance its solubility in developer solutions. Examples include p-hydroxystyrene-maleic acid anhydiride copolymers, polyhydroxystyrene-p-tertiarybutyl-carganatostyrene co-polymers, poly(2-hydroxystyrene), phenol-formaldehyde resins, polymethyl methacrylate- tertiary butyl methacrylate-polymethacrylic acid terpolymers, poly-4-hydroxystyrene-tertiary butyl methacrylate copolymers, poly(4-hydroxystyrene) with one or more acid labile alkyl or aryl substituents on the aromatic ring, a poly(3-hydroxystyrene) with one or more alkyl or aryl substituents on the aromatic ring, or any of these as the major number of subunits in a copolymer, such as PHM-C, commercially available from Maruzen America of New York, N.Y. The PHM-C includes both poly (hydroxystyrene) subunits and vinyl cyclohexanol subunits preferably being in the range of about 99:1 to about 50:50. The most preferred ratio is about 90 poly (hydroxystyrene) units to about 10 vinyl cyclohexanol subunits. Crosslinking compositions are preferably tetramethoxymethyl glycouril ("Powderlink") and 2,6-bis(hydroxymethyl)-p-cresol. However, other possible crosslinking compositions include:

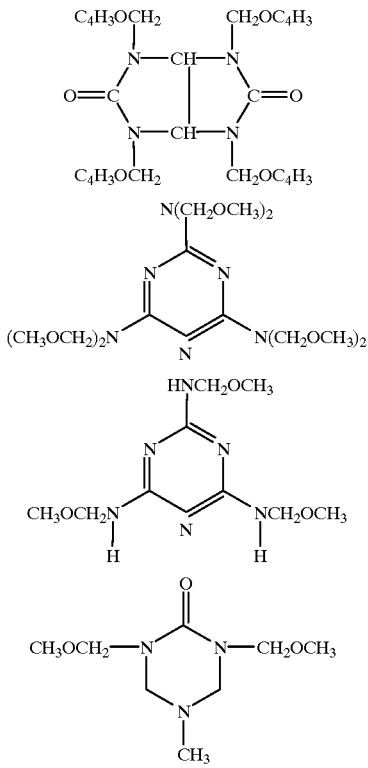

-continued

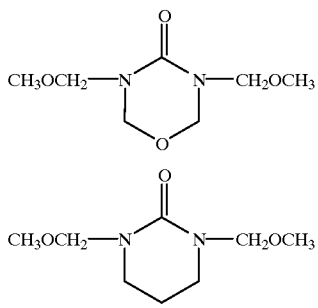

their analogs and derivatives, as can be found in Japanese Laid-Open Patent Application (Kokai) No. 1-293339, as well as etherified amino resins, for example methylated or butylated melamine resins (N-methoxymethyl- or N-butoxymethyl-melamine respectively) or methylated/butylated glycol-urils, for example of the formula:

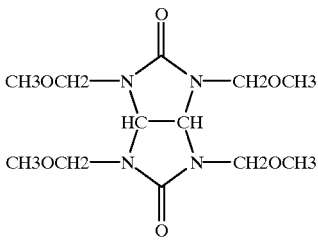

as can be found in Canadian Patent No. 1 204 547.

Photoacid generators ("PAG") include, but are not limited to: N-(trifluoromethylsulfonyloxy)-bicyclo[2.2.1]hept-5-ene-2,3-dicarboximide ("MDT"), onium salts, aromatic diazonium salts, sulfonium salts, diaryliodonium salts and sulfonic acid esters of N-hydroxyamides or -imides, as disclosed in U.S. Pat. No. 4,731,605, incorporated herein by reference. Also, a PAG that produces a weaker acid such as dodecane sulfonate of N-hydroxy-naphthalimide ("DDSN") may be used.

Possible base additives include, but are not limited to: dimethylamino pyridine, 7-diethylamino-4-methyl coumarin ("Coumarin 1"), tertiary amines, proton sponge, berberine, and the polymeric amines as in the "Pluronic" or "Tetronic" series from BASF. Additionally, tetra alkyl ammonium hydroxides or cetyltrimethyl ammonium hydroxide, may be used when the PAG is an onium salt.

Examples of sensitizers that may be utilized include: chrysenes, pyrenes, fluoranthenes, anthrones, benzophenones, thioxanthones, and anthracenes, such as 9-anthracene methanol (9-AM). Additional anthracene derivative sensitizers are disclosed in U.S. Pat. No. 4,371, 605, which is incorporated herein by reference. The sensitizer may include oxygen or sulfur. The preferred sensitizers will be nitrogen free, because the presence of nitrogen, e.g., an amine or phenothiazine group, tends to sequester the free acid generated during the exposure process and the formulation will lose photosensitivity.

A casting solvent is used to provide proper consistency to the entire composition so that it may be applied to the substrate surface without the layer being too thick or too thin. Sample casting solvents include: ethoxyethylpropionate ("EEP"), a combination of EEP and γ-butyrolactone ("GBL"), and propylene-glycolmonoethylether acetate (PM acetate).

In the following Examples, one of each of these has been chosen, however, it is to be recognized that many other compositions may be selected for various portions of the resist. In the broadest sense, the method and structure of the preferred embodiment may be achieved using any hybrid resist is comprised of a negative tone component and a positive tone component, wherein the positive tone component acts at a first actinic energy level and the negative tone component acts at a second actinic energy level, the first and second actinic energy levels being separated by an intermediate range of actinic energy levels.

EXAMPLE 1

The following compositions were dissolved in propyleneglycol monomethylether acetate (PM acetate) solvent available from Pacific Pac, Inc., Hollister, Calif. containing 350 ppm of FC-430, a non-ionic fluorinated alkyl ester surfactant available from 3M, St. Paul, Minn. for a total of 20% solids:

poly(hydroxystyrene) (PHS), 10% hydrogenated, available from Maruzen America, New York, N.Y. with about 25% of the phenol groups protected with methoxypropene (MOP), 81.2% of solids;

N-(trifluoromethylsulfonyloxy)-bicyclo-[2.2.1]-hept-5-ene-2,3- dicarboximide (MDT), available from Daychem Labs, Centerville, Ohio, 10.5% of solids;

tetramethoxymethyl glycouril (Powderlink), available from Cytec, Danbury, Conn., 8.2% of solids; and 7-diethylamino-4-methyl coumarin dye (Coumarin 1), available from the Aldrich Chemical Company, 0.1% of solids.

The solution was filtered through a 0.2 μm filter. The solution was coated onto silicon wafers primed with hexamethyl- disilazane with a soft bake of 110° Celsius (C) resulting in films of about 0.8 μm thick as determined by a Nanospec reflectance spectrophotometer. The coated wafers were then exposed with deep ultraviolet (DUV) excimer laser radiation having a wavelength of 248 nm in a 0.37 numerical aperture (NA) Canon stepper with a matrix of different doses from low doses to high doses and post expose baked (PEB) at 110° C. for 90 sec. The dissolution rates of the exposed films were calculated from the thickness of remaining film after developing for a given amount of time with 0.14 Normal (N) tetramethylammonium hydroxide (TMAH) developer. The dissolution rate vs. exposure dose relationship is shown in FIG. 6. As shown in FIG. 6, the resist has a very low dissolution rate (about 2 nm/sec) when unexposed. As the dose is increased, the dissolution rate increases until reaching about 50 nm/sec. The dissolution rate remains relatively constant at this level in the dose range of about 1 milliJoule (mJ) to about 3 mJ. Increasing the dose further, the negative cross-linking chemistry becomes predominant and the dissolution rate falls back to a value close to zero.

Figure 16:
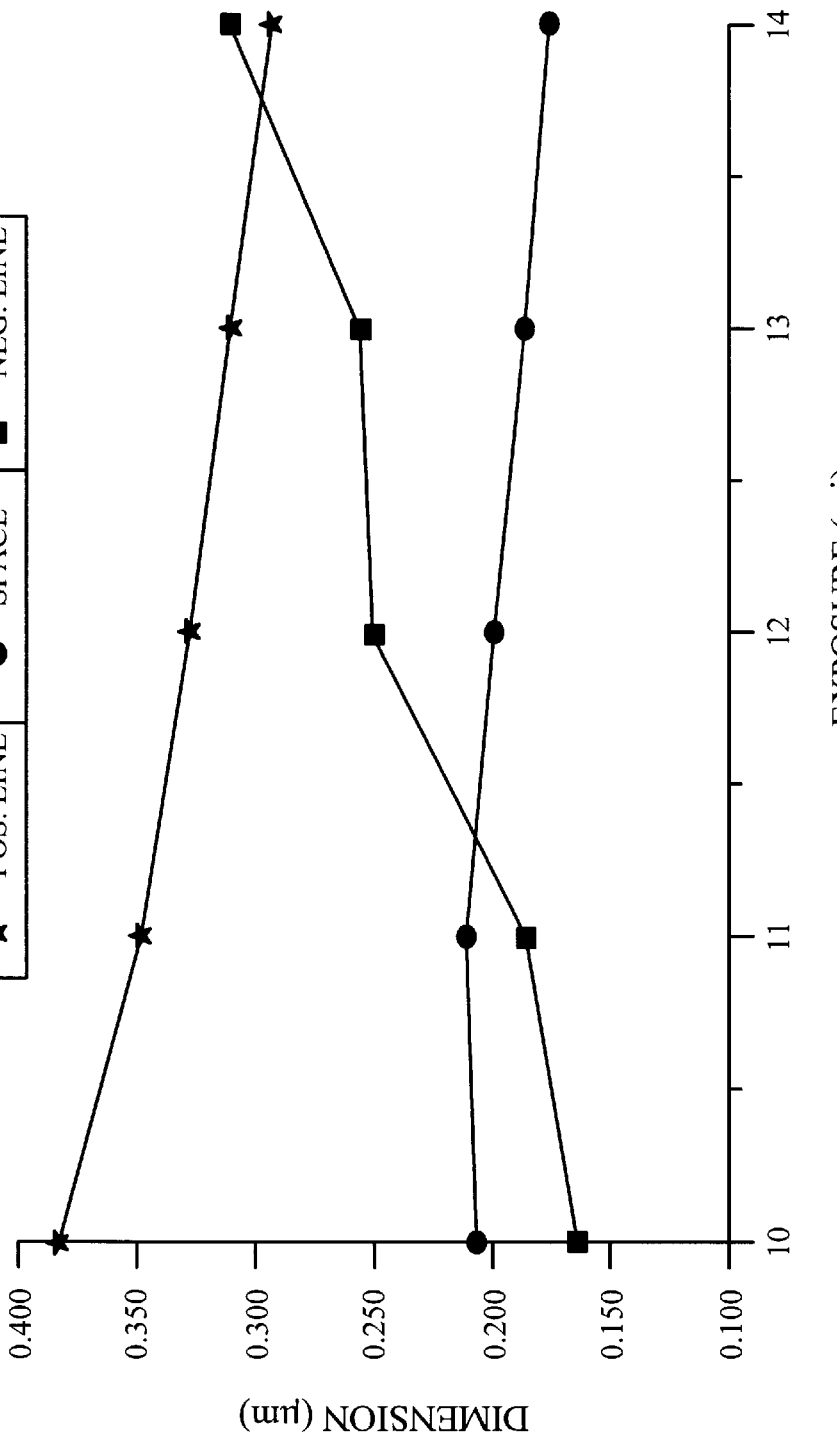
FIG. 16 is a graph of the response of a formulation of the hybrid resist of the present invention in which exposed (negative) line, unexposed (positive) line and space widths are plotted as a function of exposure dose.

A typical lithographic response of this resist is illustrated in FIG. 16, which shows the outcome of exposing the resist through a mask having 1 μm wide nested chrome lines at a pitch of 2 μm with a 248 DUV stepper with a 0.37 NA. Every chrome line and space combination in the mask prints as two lines and two spaces on the resist: a negative tone line of about 0.8 μm, a positive tone line of about 0.6 μm and two equal spaces of about 0.3 μm.

Figure 13:
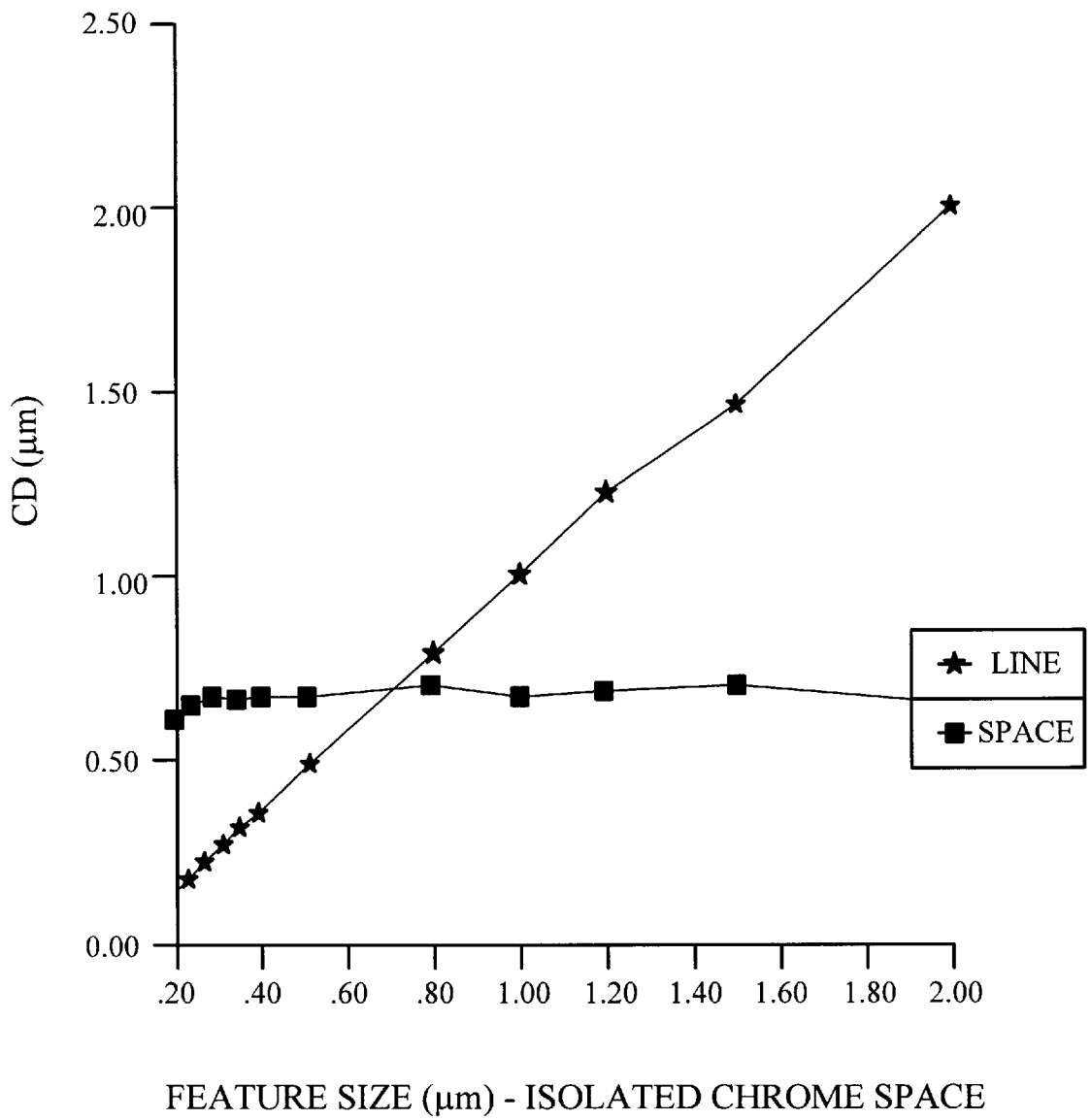
FIG. 13 is a graph showing the resultant line and space widths as functions of the chrome space width using one formulation of a hybrid resist of the present invention.

In another experiment with the same resist, when a MICRASCAN II 0.5NA DUV stepper is used to expose an isolated chrome space onto the hybrid resist film, the space/line/space measurements as a function of width of the chrome space are plotted, as shown in FIG. 13. The data suggests that, although the width of the line increases correspondingly with that of the chrome space on the mask, the space on either side of the line remains relatively constant.

EXAMPLE 2

This example illustrates the manner in which changing the type of photoacid generator and relative amounts of the various components can change the dissolution rate characteristics of the hybrid resist and subsequently the lithographic response. This second formulation was prepared and processed in a manner similar to EXAMPLE 1, however, it is comprised of the following components:

PHS with about 25% of the phenol groups protected with MOP, 90.8% of solids;

triphenyl sulfonium triflate, 1.3% of solids;

Powderlink, 7.8% of solids;

tetrabutyl ammonium hydroxide base, 0.1% of solids; and sufficient PM acetate containing 350 ppm FC-430 surfactant as a solvent to form a 18.9% solids solution.

Figure 12:
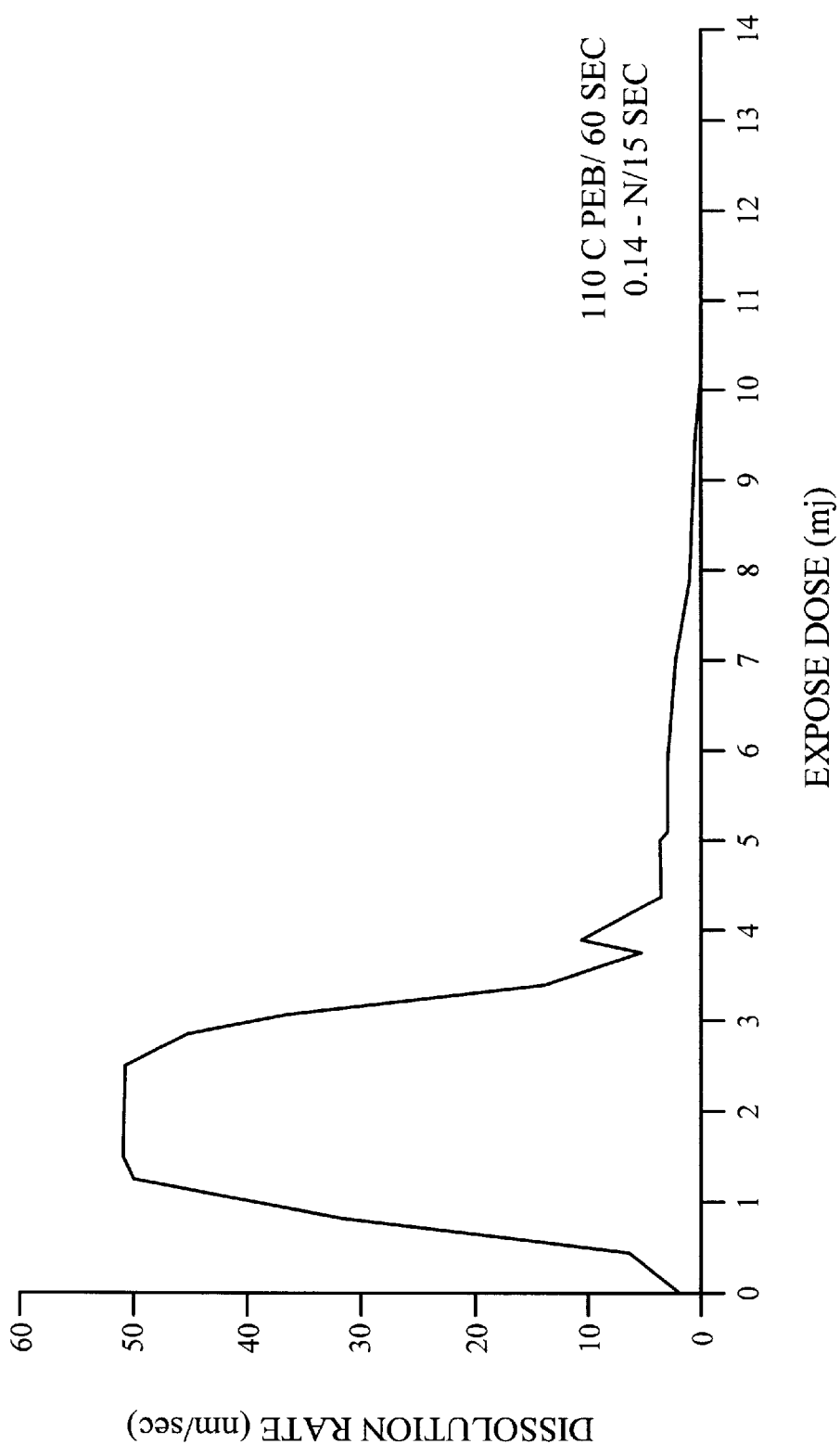
FIG. 12 is a graph showing the dissolution rate in nanometers per second (nm/sec) as a function of the exposure dose in milliJoules (mJ) using one formulation of a hybrid resist of the present invention.
Figure 14:
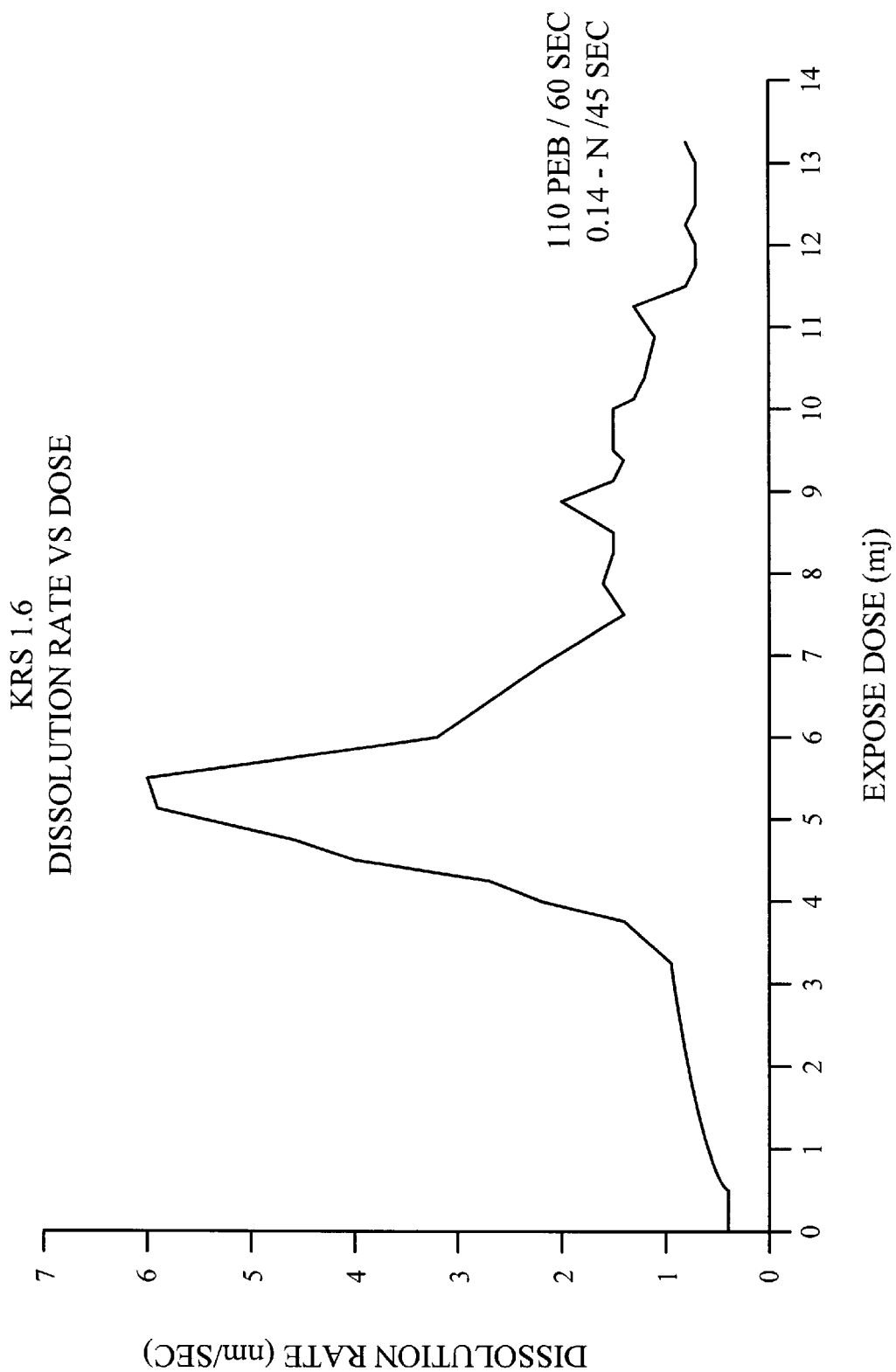
FIG. 14 is a graph showing the dissolution rate of an alternative formulation of the hybrid resist in nm/sec as a function of the exposure dose in mJ.

The dissolution rate characteristic of the resulting hybrid resist is shown in FIG. 14. The overall nature of the curve remains similar to that shown by the hybrid resist of EXAMPLE 1, in that the dissolution rate starts out low for an unexposed resist, increases to a high at about 5 mJ and decreases to a low above 7 mJ. However, the absolute dose range and the dissolution rates within these ranges are quite different from those shown in FIG. 12.

FIG. 16 represents the response of this formulation of the hybrid resist when exposed through a mask of nested chrome lines and spaces of equal widths in a MICRASCAN II DUV 0.5 NA stepper tool. Negative line, unexposed (positive) line and space widths are plotted as a function of mask dimension. The space remains relatively constant in the range of about 0.18 $\mu$m, whereas both lines vary as the mask dimension is varied.

EXAMPLE 3

This example illustrates that the space width of the frequency doubled image can be changed by varying the protection level of PHS with MOP. Two different PHS lots having 24% and 15% MOP loading, respectively, were used to make hybrid formulations identical to that of EXAMPLE 1, except that the total solids contents were adjusted to 16.0% of the total to obtain film thicknesses of about 0.5 $\mu$m. From these two stock formulations, several other formulations with average MOP levels ranging from 15 to 24% were prepared. Wafers were coated and soft baked at 110° C., exposed on a MICRASCAN II DUV 0.5 NA stepper, post exposed baked at 110° C. for 60 sec and finally developed with 0.14N TMAH developer. A reticle with an isolated chrome opening was printed in a hybrid resist film. The spacewidth of the resist image was measured and graphed as a function of the average MOP solubility inhibitor loading in the PHS used for making the respective formulations. It was found that the space width was strongly dependent on MOP concentration, as shown in FIG. 15.

EXAMPLE 4

Negative tone imaging may be performed with the hybrid resist of the present invention, using a blanket DUV expose after the PEB and prior to the develop.

A hybrid resist formulation as described in EXAMPLE 2, above, was image-wise exposed with a chrome reticle with an electrical test pattern on a 0.5NA DUV expose system. Silicon wafers (200 mm) with a 2000 Angstrom (Å) film of polysilicon were used as a substrate so that the resulting etched patterns of the resist image could be measured with electrical probe techniques. After the post expose bake process, the wafers were cycled back into the expose tool (MICRASCAN II) and exposed at 10 mJ per square centimeter (cm$^2$) with a clear glass reticle. A post expose bake process was not performed after the second exposure. The purpose of the second exposure was to remove the initially unexposed resist from the wafer, leaving only a negative tone resist pattern after develop.

The initial image-wise expose dose was 17–24 mJ/cm2, the post expose bake temperature was 110° C. for 90 sec and the develop time was 100 sec in 0.14N TMAH. A standard negative tone resist was processed in a similar fashion, with the omission of a blanket expose step as a control. The electrical data from this experiment is shown in FIGS. 8 and 9. A large isofocal print bias of approximately 0.11 $\mu$m was observed for the hybrid resist relative to the standard negative resist, as calculated using standard methods known in the art.

Figure 17:
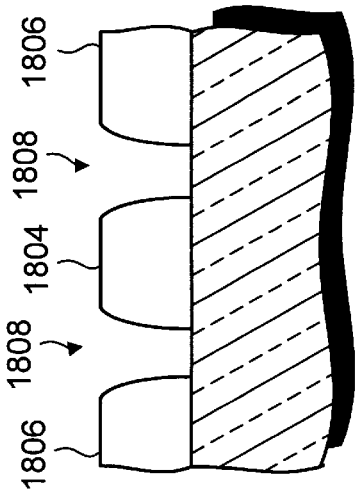
FIG. 17 is a schematic view of an exemplery mask portion.
Figure 19:
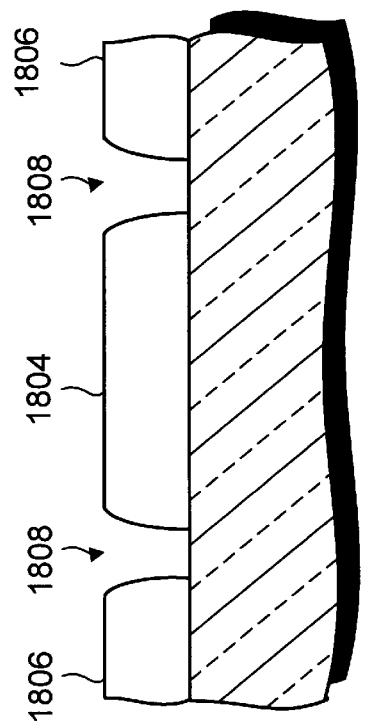
FIG. 19 is a cross-sectional side view of the wafer portion of FIG. 18 taken along line 19—19.
Figure 20:
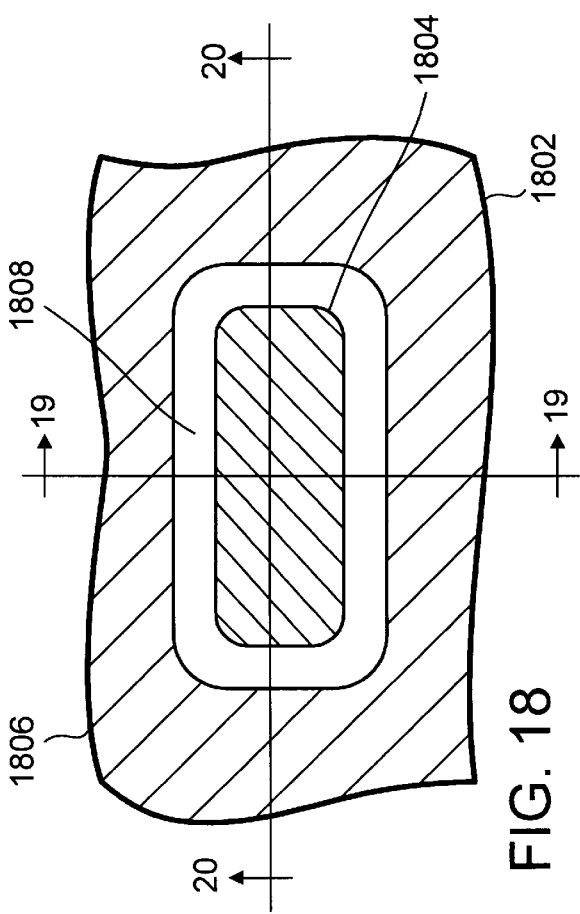
FIG. 20 is a cross-sectional side view of the wafer portion of FIG. 18 taken along line 20—20.

When hybrid resist is exposed to actinic energy, areas of the resist which are subject to a full exposure form a negative tone line pattern, areas which are unexposed form a positive tone pattern, and areas which are exposed to intermediate amounts of radiation become soluble and wash away during development. Turning to FIG. 17, an exemplary mask 1700 containing a mask blocking shape 1702 is illustrated. When hybrid resist is deposited on a wafer, exposed through mask 1700 with actinic radiation, and developed, the mask 1700 creates the a "linked" or "donut" pattern in the hybrid resist. Such a linked pattern is illustrated FIGS. 18, 19 and 20, where FIG. 19 is a cross section of the wafer in FIG. 18 taken along lines 19—19, and FIG. 20 is a cross section of the wafer in FIG. 18 taken along lines 20—20.

Figure 18:
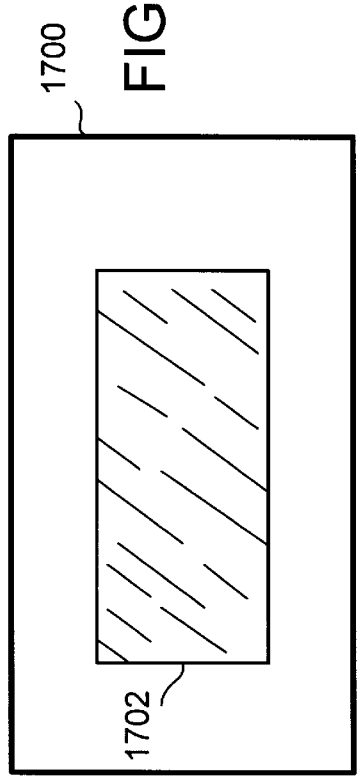
FIG. 18 is a top schematic view of a wafer portion with patterned hybrid resist upon it.

FIG. 18 shows a wafer portion 1802 upon which hybrid resist has been deposited, exposed through mask 1700 containing a blocking shape 1702 and developed. Hybrid resist portions which are unexposed (i.e., the inside region 1804 blocked by mask shape 1702) remain photoactive and insoluble in the developer and form positive tone line patterns. Hybrid resist portions which are exposed with high intensity radiation (i.e., the outside region 1806 not blocked by mask shape 1702) are completely cross-linked during the post exposure bake and form a negative tone line pattern. Hybrid resist portions which are exposed with intermediate amounts of intensity (i.e., the areas under the edges of mask shape 1702) become soluble in developer solution after the first exposure and are dissolved during the development step and form space 1808 in the hybrid resist.

Because portions of the hybrid resist were unexposed during the first exposure, these regions remain photoactive and now comprise positive tone resist patterns. Thus, by blanket exposing the wafer these positive tone resist patterns are polymerized and can be washed away during development. The blanket exposure is preferably an intermediate exposure, either by exposing at a low enough dose or for a short enough to create an intermediate response to those areas of resist that were unexposed (i.e, the positive tone patterns) in the first exposure step.

In the alternative, the positive tone portions can be removed by a selective etch using a solution of pure n-butyl acetate at room temperature or with a strong base, such as 0.35 Normal ("N") tetramethyl ammonium hydroxide ("TMAH").

Figure 22:
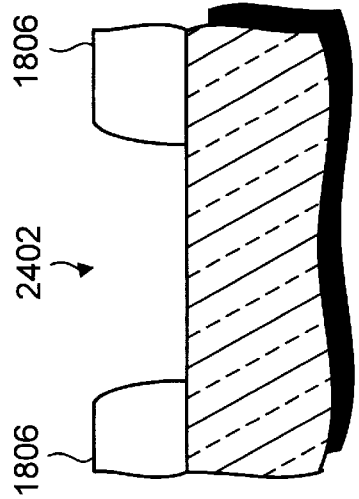
FIG. 22 is a cross-sectional side view of the wafer portion of FIG. 21 taken along line 22—22.
Figure 23:
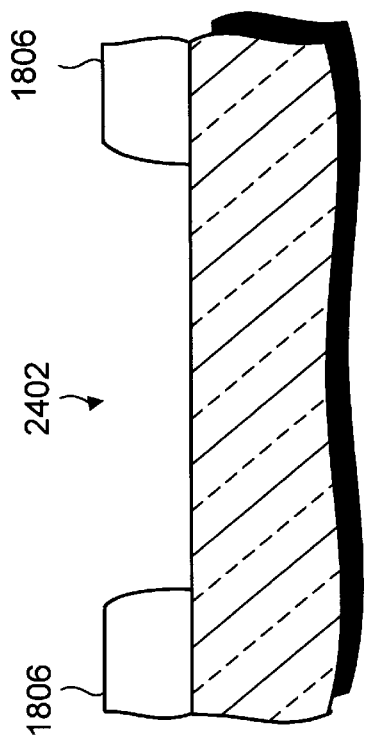
FIG. 23 is a cross-sectional side view of the wafer portion of FIG. 21 taken along line 23—23.
Figure 21:
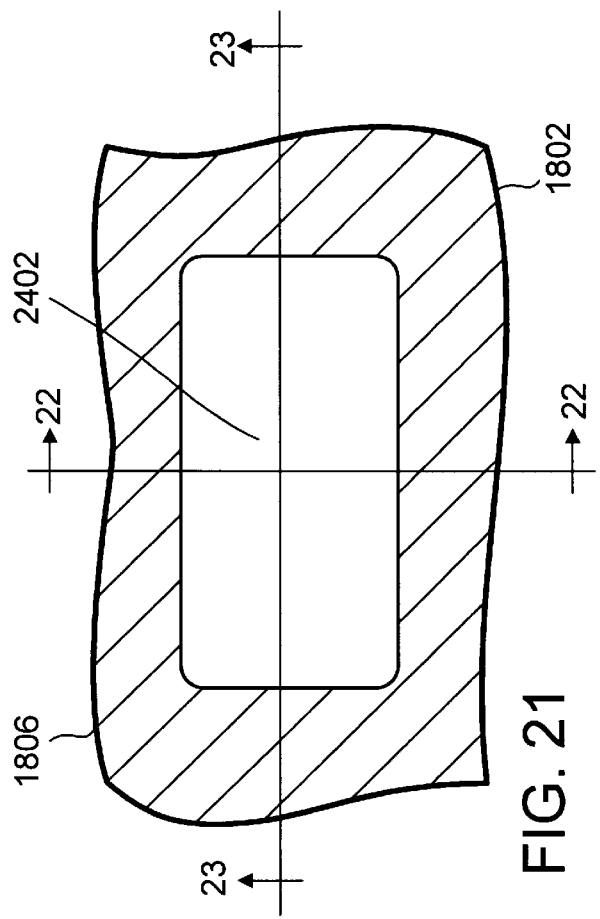
FIG. 21 is a top schematic view of a wafer portion with patterned hybrid resist and positive tone portions removed.

Turning to FIGS. 21, 22, and 23, the wafer portion 1802 is illustrated after a blanket exposure and development, where FIG. 22 is a cross section of the wafer portion in FIG. 21 taken along lines 22—22, and FIG. 23 is a cross section of the wafer taken along lines 23—23.

The blanket exposure has caused the positive tone regions (i.e., the hybrid resist portion 1804 (of FIGS. 18, 19 and 20)) which were unexposed (i.e., blocked by mask shape 1702) to become soluble and wash away during development.

Preferred Embodiments

The preferred embodiments capitalize on the unique properties of hybrid resist to form a field effect transistor. In particular, the preferred embodiments form a field effect transistor with raised source and drain regions that overcomes the disadvantages of the prior art. In particular, the preferred embodiment transistors have an improved source and drain current leakage which leads to an improved resistance to latch up. In addition, by using hybrid resist the preferred embodiments facilitate the formation of the transistor with high precision and consistency.

The preferred embodiment forms the source and drain regions of the transistor on a raised region formed above the substrate. In particular, in the preferred embodiment the source and drains are formed in the same layer of material (e.g., polysilicon) deposited to form the transistor gate. By forming the source and drain regions above and isolated from the substrate, a transistor with improved performance is provided. These improvements include lowering the junction area which lowers junction capacitance and junction leakage, allowing larger isolation regions between devices which improves latch-up immunity, and providing a raised region that can act as a local interconnect. The raised source/drains also make the contact process easier by having the source/drains the same height as the gates.

The preferred method for forming a field effect transistor uses a novel method of forming sidewall spacers. The novel method allows spacers to be selectively formed on certain sidewalls while not forming sidewall spacers on other sidewalls. This novel method uses the unique properties of hybrid resist to selectively form these sidewall spacers in a completely self-aligned fashion, with no further exposure through mask reticles required.

Figure 24:
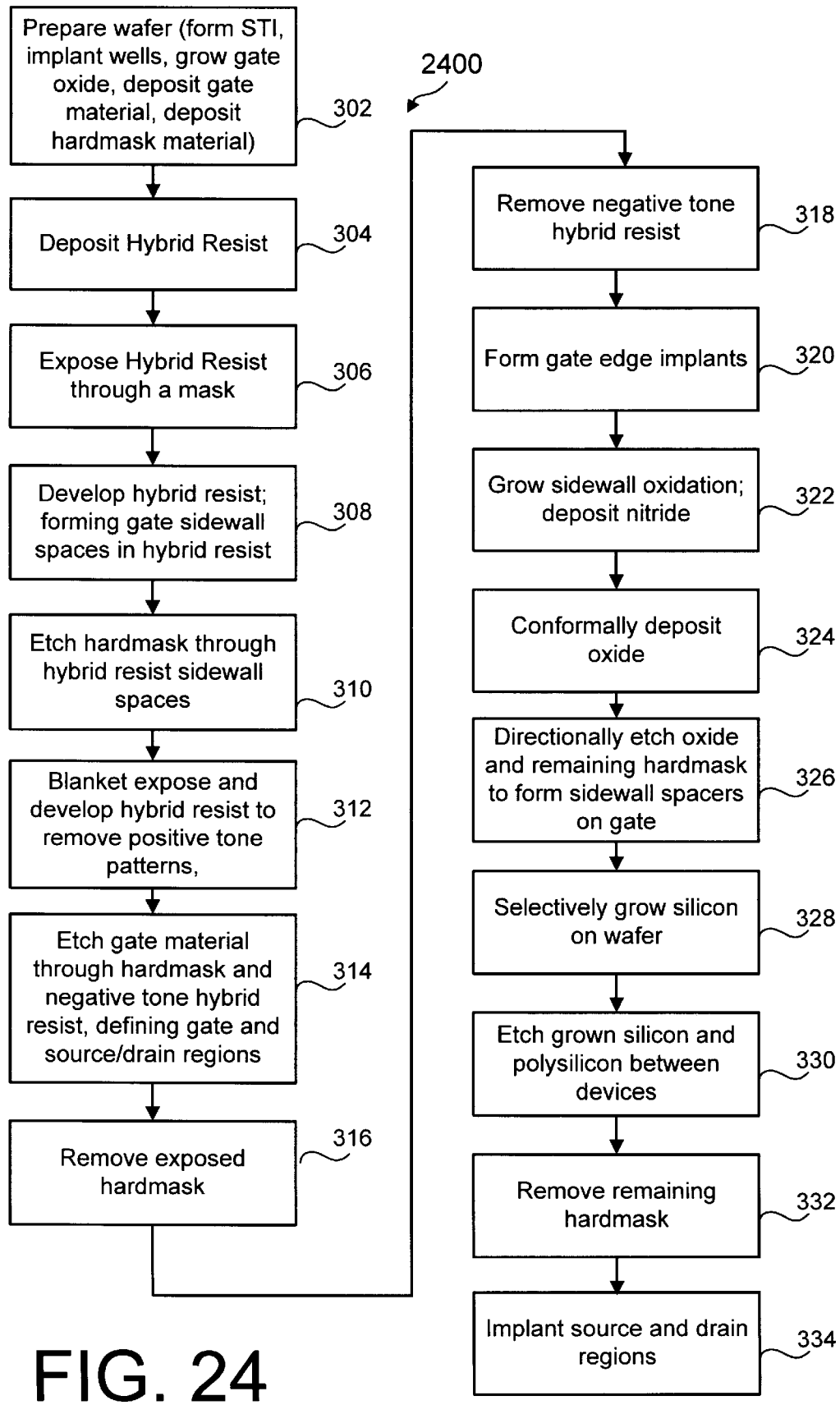
FIG. 24 is a flow diagram illustrating a preferred embodiment method.

Turning to FIG. 24, a method 2400 for forming a field effect transistor (FET) that includes raised source and drain regions is illustrated The first step 302 is to prepare the wafer for the fabrication of the FET. This would typically include the formation of isolation, such as shallow trench isolation (STI); implanting wells; the growing of gate oxide, the deposition of gate material (a suitable conductor such as polysilicon) and the deposition of a hardmask (suitably an inorganic material such as a nitride).

In the preferred embodiment, the depth of the hardmask deposited is enough to allow sufficient etching of the sidewall spacer without etching into the gate material itself, as will be explained further in conjunction with step 326.

As will be discussed in further details, the gate oxide layer will, in addition to serving as the gate dielectric, be used to isolate the raised source and drain regions from the substrate.

The formation of STI regions is preferably done using the unique properties of hybrid resist as disclosed in sister application "Method of Defining Three Regions Using a Single Masking Step and Device Formed Thereby," Attorney Docket No. BU9-96-149, Ser. No. 08/895,748, but any other suitable method for forming isolation regions could be used.

As will be discussed in more detail later, the source and drain regions of the preferred embodiment are formed above the substrate in deposited polysilicon Because the source and drain are separated from the substrate by oxide, less STI can be used to isolate the devices. In particular, in prior art methods the STI defined the gate channel width and the source and drain regions, requiring an STI region to be formed between almost all structures on all devices. Because the preferred embodiment source and drain regions are isolated from the substrate, STI is only needed in small islands at the ends of the gates which define the device channel width. This simplifies the STI fabrication process and allows device densities to increase.

In particular, the preferred embodiment allows the space between devices (in some regions) to be made smaller due to the reduced contacted area to substrate (P-well or N-well). Typically, latch-up rules dictate how much space is needed to isolate NFETs from PFETs. In the preferred embodiment with a large part of the source/drain regions being above and isolated from the substrate, the space between devices is large (as measured from junction to junction). This allows circuit density to increase without latch-up design rule limitations. Instead density will typically be limited only by contact rules. The advantage of a local interconnect formed by the isolated raised source/drains will also increase circuit density.

The next step 304 is to deposit hybrid resist, such as any of the hybrid resist formulations discussed above. Then, in step 306, the hybrid resist is exposed through a mask with shapes that define the gate sidewall regions. In the preferred embodiment, the mask shapes include edges that correspond to the gate sidewall regions such that those areas of the hybrid resist are exposed to intermediate amounts of exposure. Areas of the hybrid resist not blocked during exposure and hence fully exposed become cross linked and form a negative tone pattern. Areas of the hybrid resist blocked during exposure remain unexposed and photoactive, and hence comprise a positive tone pattern. Then in step 308 the exposed hybrid resist is developed. This causes areas of intermediate exposure to develop away, forming gate sidewall spaces in the hybrid resist.

It should also be noted that one advantage in using hybrid resist is that intermediate gate sidewall spaces formed under the edges of mask shapes can be printed with a width of less than 0.2 $\mu$m with current deep ultra violet (DUV) lithography tools that are designed for operation at 0.35 $\mu$m resolution. Thus, by using the edge of a mask shape to define spaces in hybrid resist, smaller dimension features can be created than normal lithography allows. The preferred width of the hybrid resist space is between 0.1 $\mu$m and 0.3 $\mu$m, with the most preferred width at approximately 0.2 $\mu$m.

Figure 25:
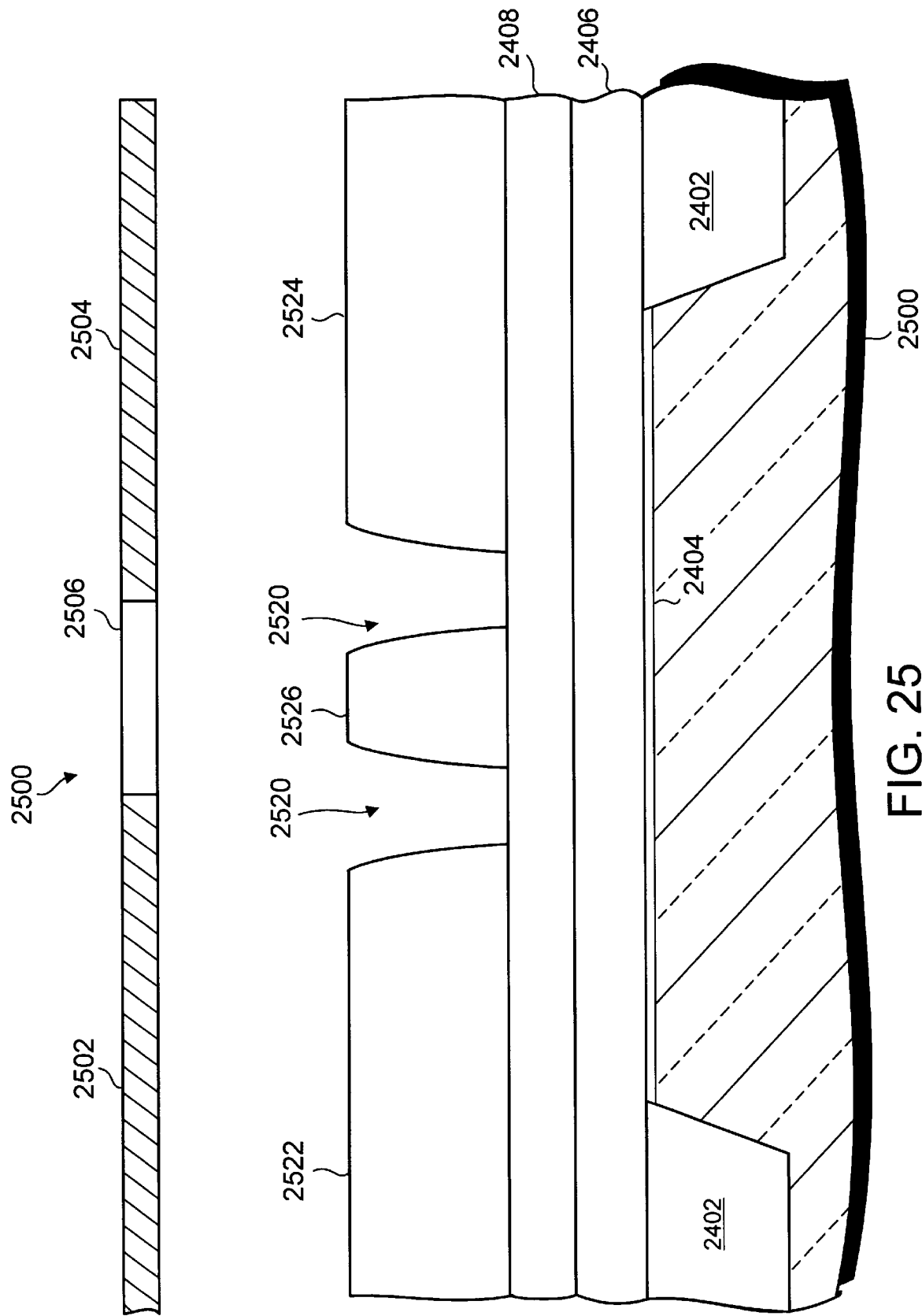
FIGS. 25–35 are cross-sectional side views of a wafer portion in fabrication in accordance with the preferred embodiment.

Turning to FIG. 25, a wafer portion 2500 is illustrated. The wafer portion includes two shallow trench isolation regions 2402 previously formed, a layer of gate oxide 2404, a gate material layer 2406, and a hardmask layer 2408, in accordance with step 302. A hybrid resist layer has been deposited, exposed through a mask portion 2500, and developed in accordance with steps 304–308. The mask portion 2500 includes two blocking shapes 2502 and 2504 which block the hybrid resist during exposure, and a non-blocking shape 2506. Thus, the areas of hybrid resist under the edges of blocking shapes 2502 and 2504 are exposed to intermediate amounts of exposure, and become soluble and wash away during development. This forms gate sidewall spaces 2520 in the hybrid resist.

Additionally, the hybrid resist portions which were unexposed in step 306 (i.e., the regions under blocking shapes 2502 and 2504) remain insoluble in the developer and form positive tone patterns 2522 and 2524 of hybrid resist. Hybrid resist portions which are exposed with high intensity radiation (i.e., the regions under non-blocking shape 2506) form a negative tone line patterns 2526 of hybrid resist.

Figure 26:
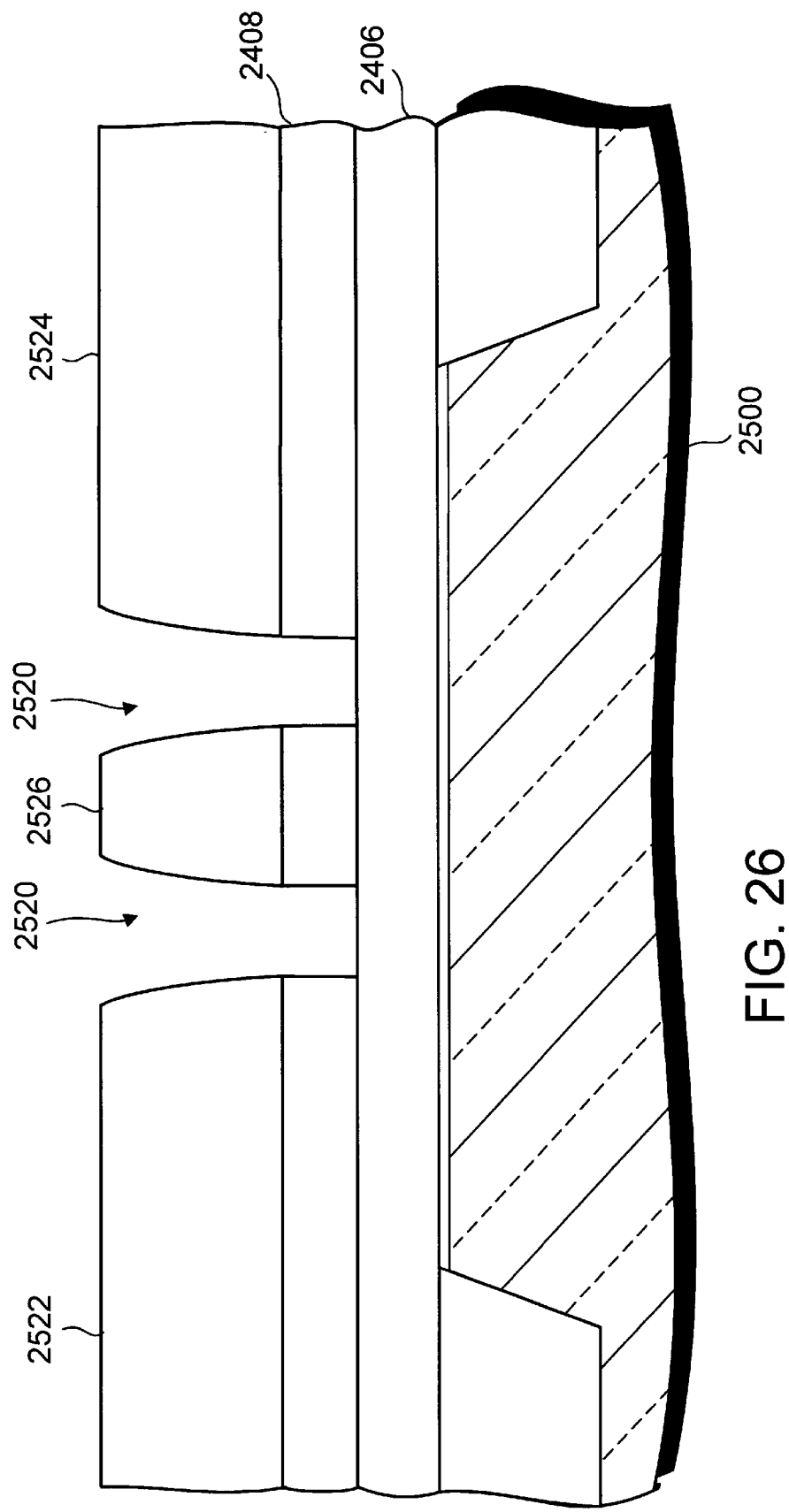

With the hybrid resist so patterned, the next step 310 is to etch the hardmask through the spaces in the hybrid resist. This etch is preferably done by a nitride reactive ion etch with $NF_3$ and argon or $CHF_3$ and $O_2$, but any suitable etch procedure that removes the hardmask without reacting with the positive tone portions of the hybrid resist could be used. Turning to FIG. 26, the wafer portion 2500 is illustrated with the hardmask layer 2408 etched away under the spaces 2520.

Figure 27:
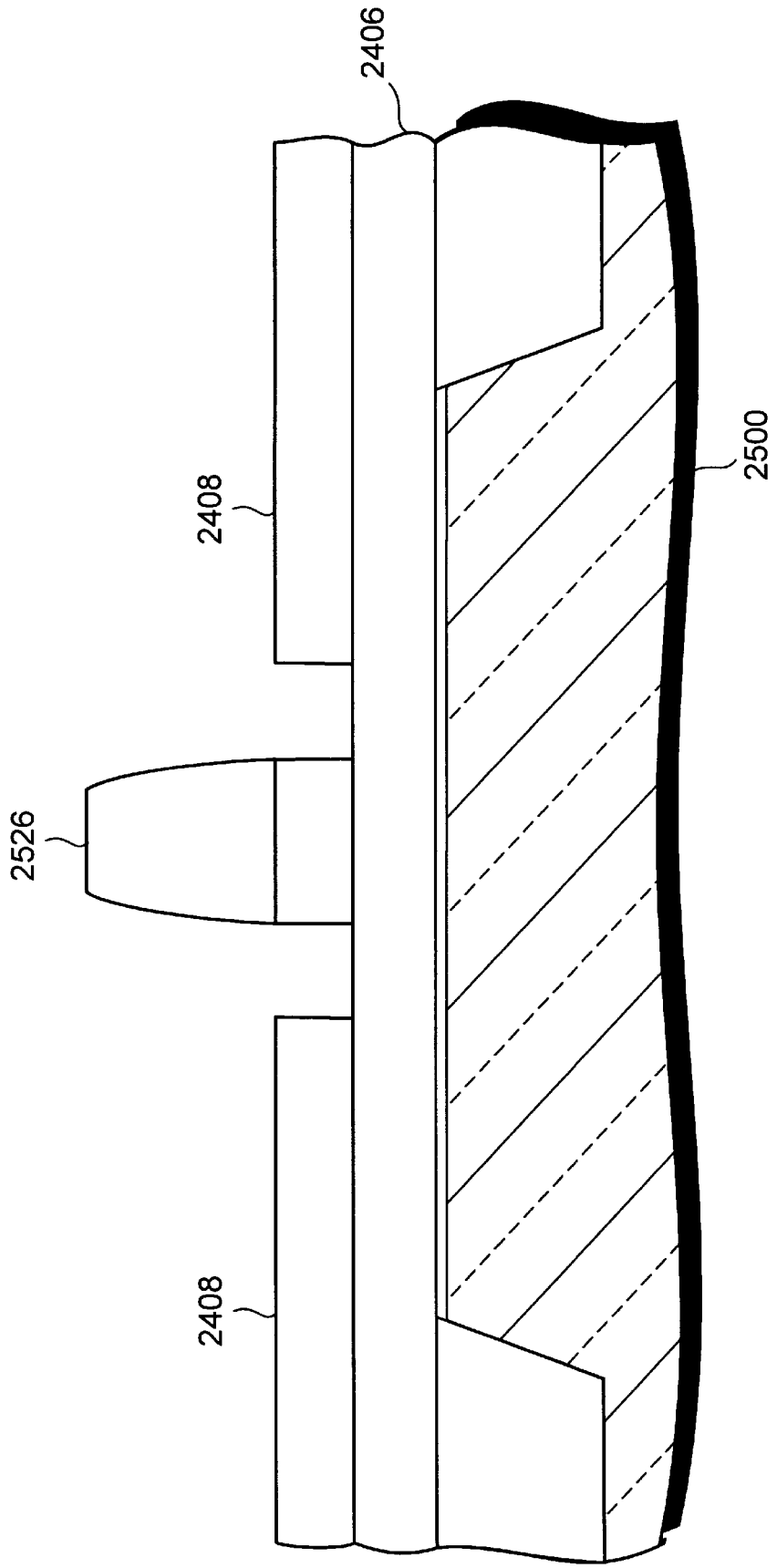

The next step 312 is to blanket expose the hybrid resist and develop. The blanket exposure is preferably an intermediate exposure, either by exposing at a low enough dose or for a short enough time to create an intermediate response to those areas of resist that were unexposed (i.e, the positive tone patterns) in the first exposure step. This step causes the positive tone patterns of the hybrid resist to become soluble and wash away, while leaving the negative tone patterns of hybrid resist. Turning to FIG. 27, the wafer portion 2500 is illustrated with the positive tone patterns 2522 and 2524 developed away. This procedure does not damage the negative tone patterns 2526 of hybrid resist.

In the alternative, the positive tone portions can be removed by a selective etch using a solution of pure n-butyl acetate at room temperature or with a strong base, such as 0.35 Normal ("N") tetramethyl ammonium hydroxide ("TMAH"). This solvent could be tuned so that it would selectively remove the positive tone areas independent of the negative tone areas, which are cross-linked and are therefore generally insoluble. Again, this would reduce the potential for problems with the positive tone resist areas remaining photoactive through the nitride etch process and does not require additional processing steps.

The next step 314 is to etch the gate material through the remaining hybrid resist and the remaining hardmask to define sidewall spacer troughs in the gate material layer. This etching forms a pair of proximately located openings in the gate material layer and defines the gate material layer into a first portion between the openings which will comprise the gate, and a second portion adjacent the openings which will comprise the source and drain. Thus, the gate material layer is defined into a gate portion, a raised source portion and a raised drain portion. This etching is preferably done using a halogen/oxygen mixtures such as chlorine/He/$O_2$, but could also be accomplished with any other suitable etch procedure. This step defines gate sidewall troughs through which implants can be formed in the underlying silicon and which sidewall spacers can be formed.

Figure 28:
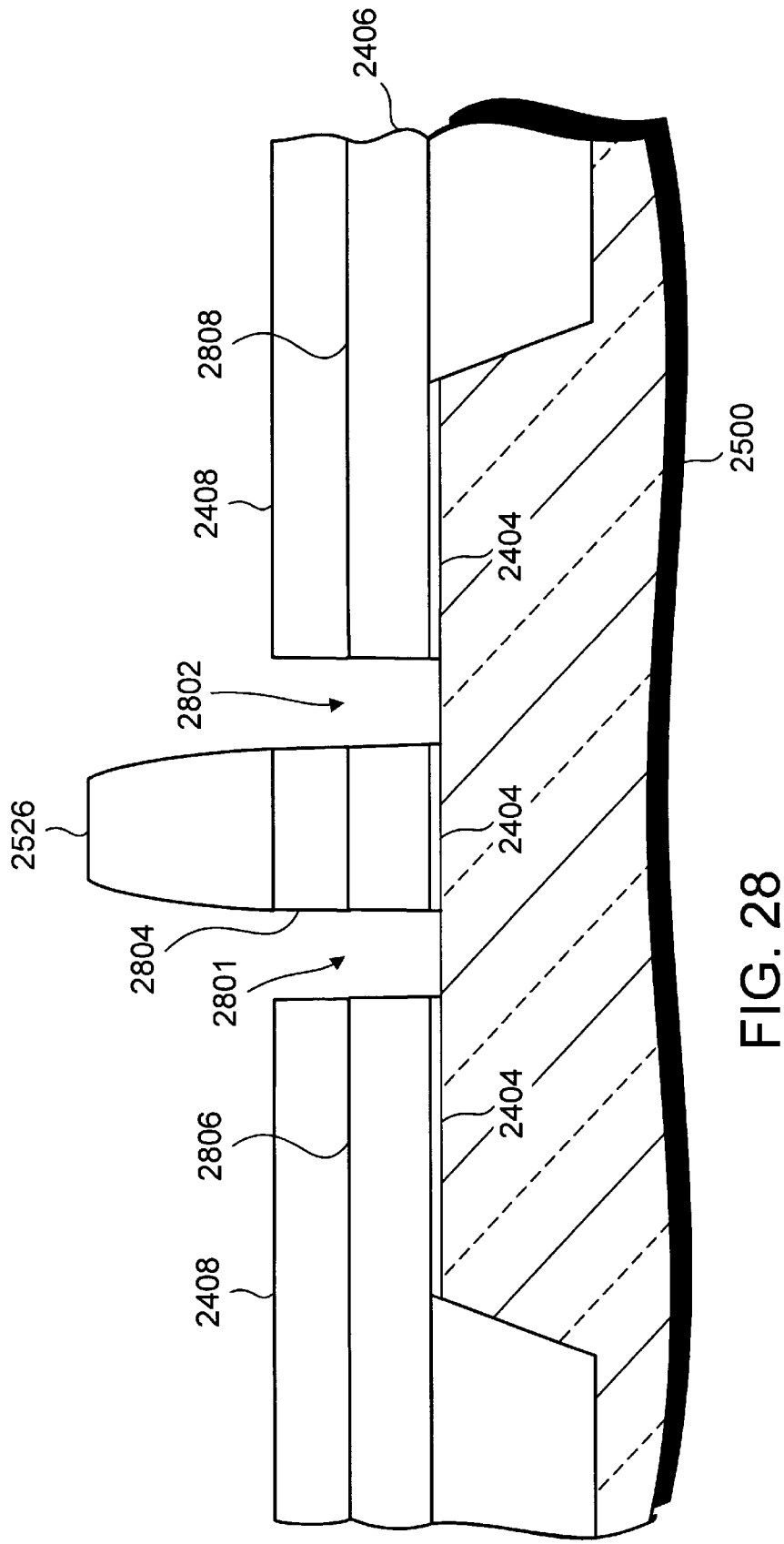

Turning to FIG. 28, the wafer portion 2500 is illustrated with sidewall troughs 2801 and 2802 formed in the gate material layer 2406 and the gate oxide layer 2404. The sidewall troughs 2801 and 2802 have defined the gate material layer 2406 into three regions, namely a gate region 2804, a raised source region 2806 and a raised drain region 2808. The remaining negative tone pattern 2526 and the remaining hardmask layer 2408 both serve to mask the etch step that forms the sidewall spacer troughs 2801 and 2802 Because the sidewall troughs 2801 and 2802 were defined using hybrid resist, they can be formed smaller than conventional lithography allows. This facilitates the formation of sidewall spacer troughs 2801 and 2802 that have a smaller feature size than could be created with conventional methods. This allows precise control of implants into the wafer.

The next step 316 is to remove the exposed hard mask. This is preferably done by etching the nitride and oxide selective to the remaining negative tone hybrid resist pattern.

Figure 29:
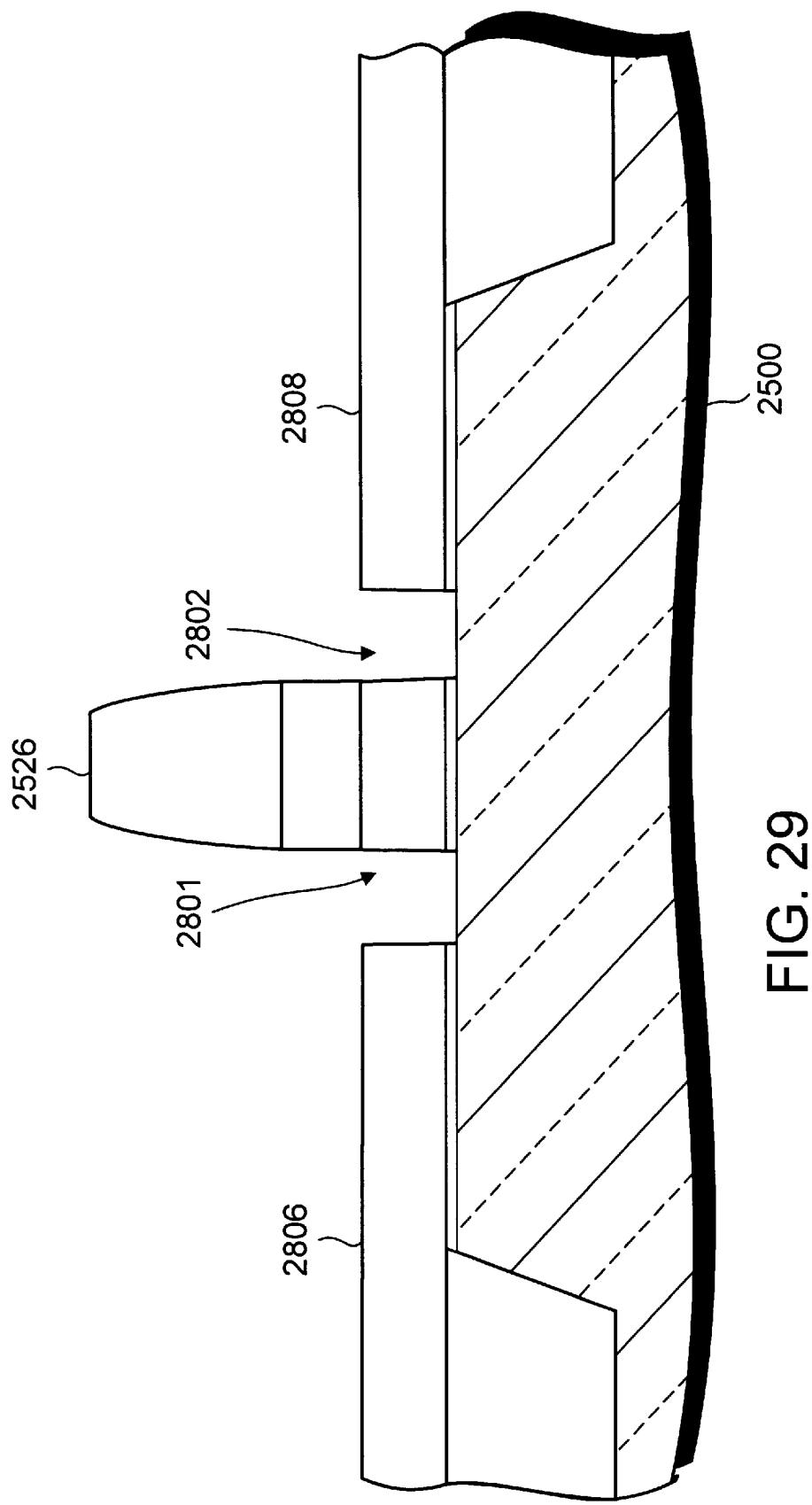

Turning to FIG. 29, the wafer portion 2500 is illustrated with the exposed portions of hardmask layer 2408 removed where it was not protected by the negative tone pattern 2526 of hybrid resist.

Figure 30:
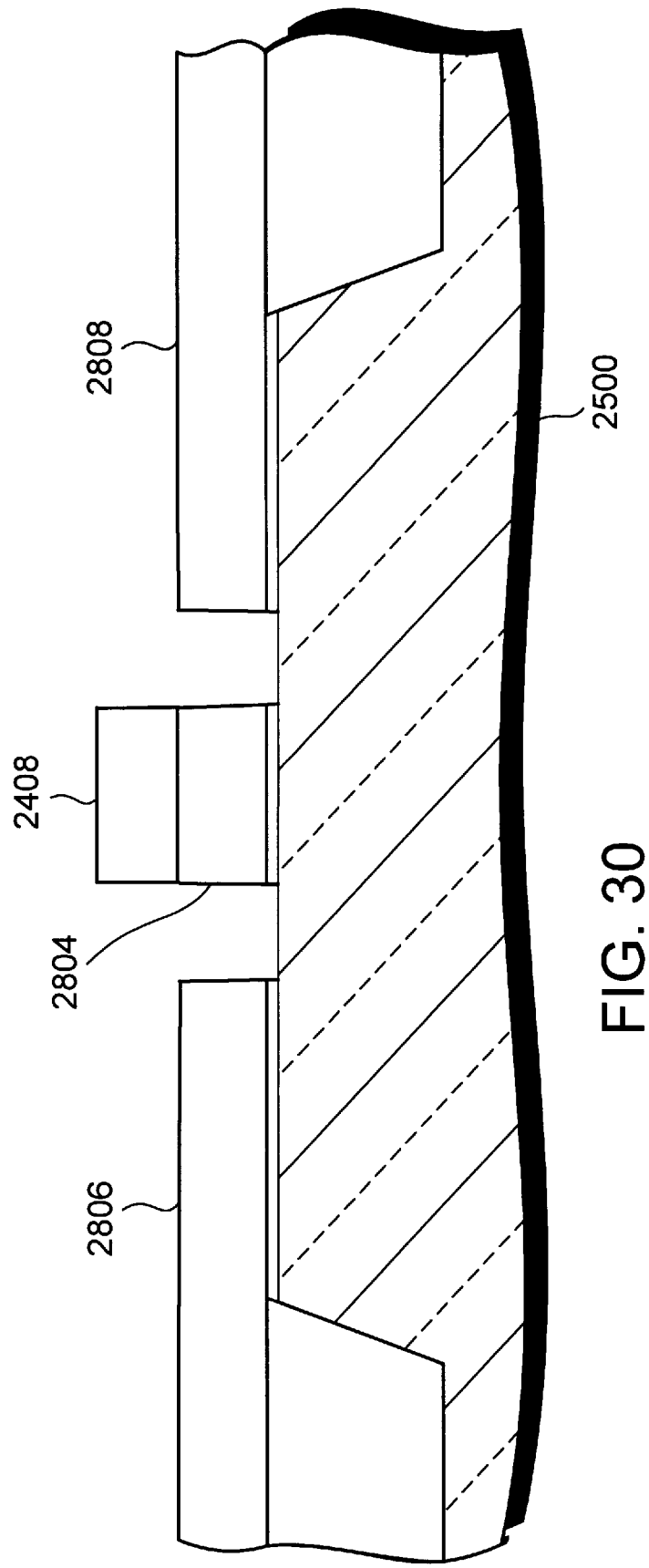

The next step 318 is remove the remaining negative tone hybrid resist. This is generally done by the stripping the resist using a plasma resist strip. This exposes the remaining hardmask over the field effect transistor gate. Turning to FIG. 30, the wafer portion 2500 is illustrated. The negative tone pattern 2526 has been removed, exposing the remaining portion of hardmask 2408 which covers the patterned gate material.

The next step 320 is to form gate edge implants. Because the preferred embodiment has formed sidewall troughs of a minimum feature size at the edges of the gate, a very precise gate edge implant to tailor the doping at the gate edge can be made. By contrast, without additional masking steps the prior art method which uses a traditional conformal deposition/directional etch sidewall spacer only had a limited ability to selectively tailor the doping at the gate edge. In particular, the prior art only had the ability to implant across the entire active area (except where blocked by the gate), then form the sidewall spacer, and implant again across the entire active area (except where blocked by the gate and sidewall spacers). Thus, any dopant added to the gate edge also had to be added across the entire active area. This severely limited the type of implants that could be made.

The gate edge implants can be any type of implant designed to improve the performance of the FET. In the preferred embodiment, a lightly doped implant is formed followed by a halo implant. The lightly doped implant preferably comprises a dopant of the same species as the source and drain regions with a doping density between $1 \times 10^{13}$ and $5 \times 10^{15}$ ions/cm$^2$, with a preferred doping density of approximately $1 \times 10^{14}$ ions/cm$^2$. The halo comprises a dopant of the opposite species of the lightly doped implant, implanted slightly deeper than the lightly doped implant. The halo causes the background doping at the lightly doped implant/substrate transition to be slightly higher than it would be normally.

The lightly doped implant improves the operation of the FET by channeling the device current to the surface of the FET. The halo helps reduce short channel effects (i.e., threshold voltage rolloff, punchthru).

By contrast, in prior art methods where any implants made had to be made across the entire active area, any similar implants would result in excessive junction capacitance by creating a bigger junction capacitor.

Figure 31:
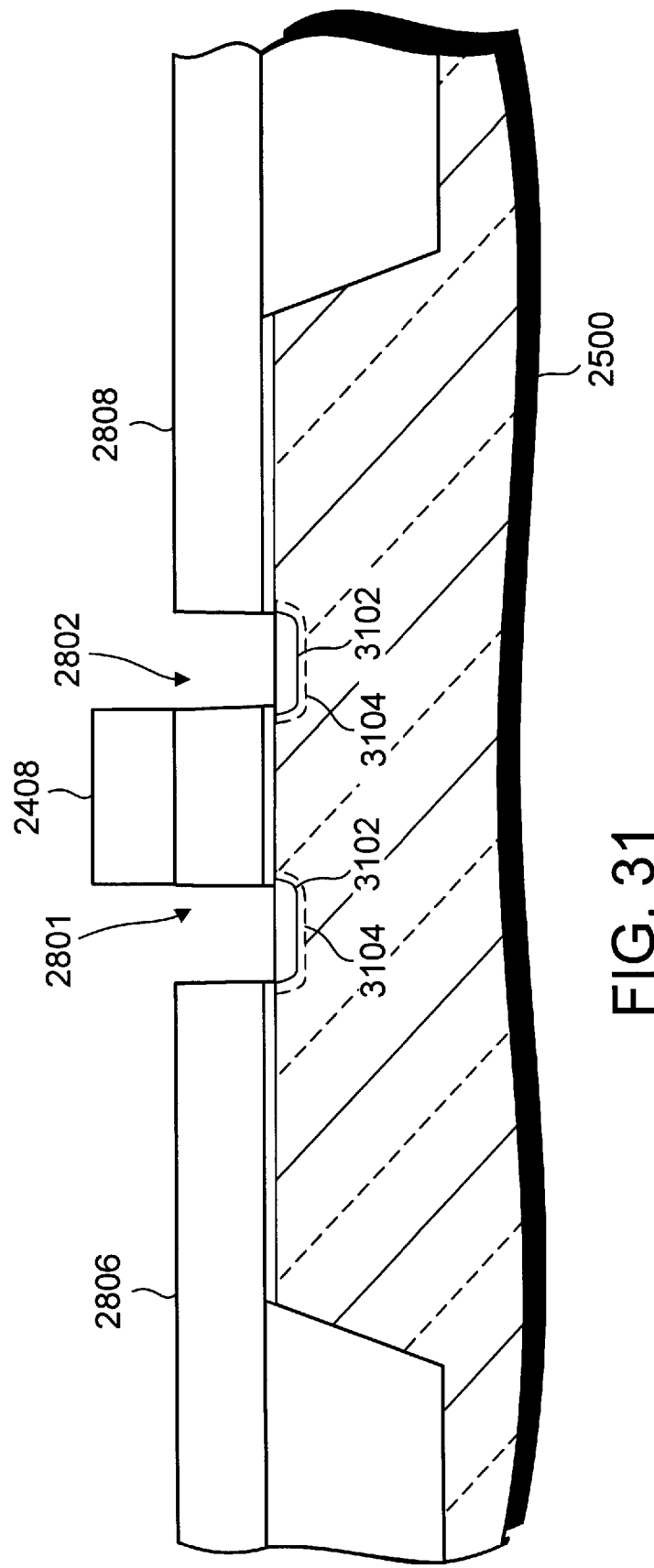

Turning to FIG. 31, the wafer portion 2500 is illustrated with gate edge lightly doped implants 3102 and gate edge halo implants 3104 formed at the edges of the gate 2804. The width of these implants is defined by the sidewall spacer troughs 2801 and 2802 formed in the polysilicon gate material 2406 by the hybrid resist process. Thus both the gate edge lightly doped implants 3102 and the gate edge halo implants 3104 can be precisely defined.

Figure 32:
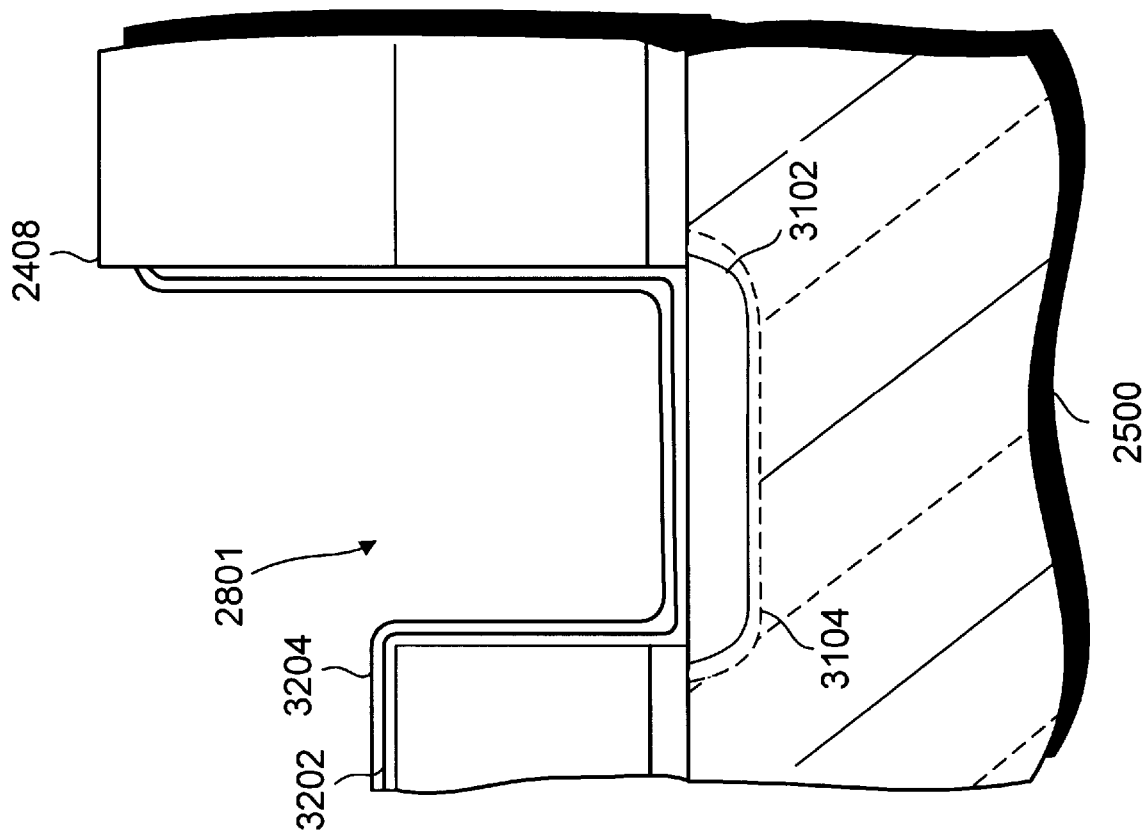

The next step 322 is to grow sidewall oxidation and deposit a thin nitride stop layer in the sidewall spacer troughs 2801 and 2802. As will be explained later, this step is optional, but is desirable to prevent the possibility of unwanted gate material etching during planarization. Turning to FIG. 32, a close up of wafer portion 2500 is illustrated with sidewall oxidation layer 3202 and a nitride stop layer 3204 formed in the sidewall spacer trough 2801.

To summarize the processing that has occurred to this point, hybrid resist was used to define three regions on the FET, i.e., the region comprising the gate, the regions defining the source and drains, and the troughs between them. The unique properties of hybrid resist facilitated the formation of the troughs, the removal of the hardmask from above source and drain regions while leaving the hardmask above the gate region in a self aligned process with a single reticle exposure step. Because the hardmask remains only above the gate portion, the trough sidewalls on the gate side are significantly deeper then the sidewalls on the source and drain sides of the troughs. This difference in depth, combined with the hardmask atop the gate region, will facilitate sidewall spacers to be formed which cover the sidewalls of the gate, but are not formed on the sidewalls of the raised source and drain.

Figure 33:
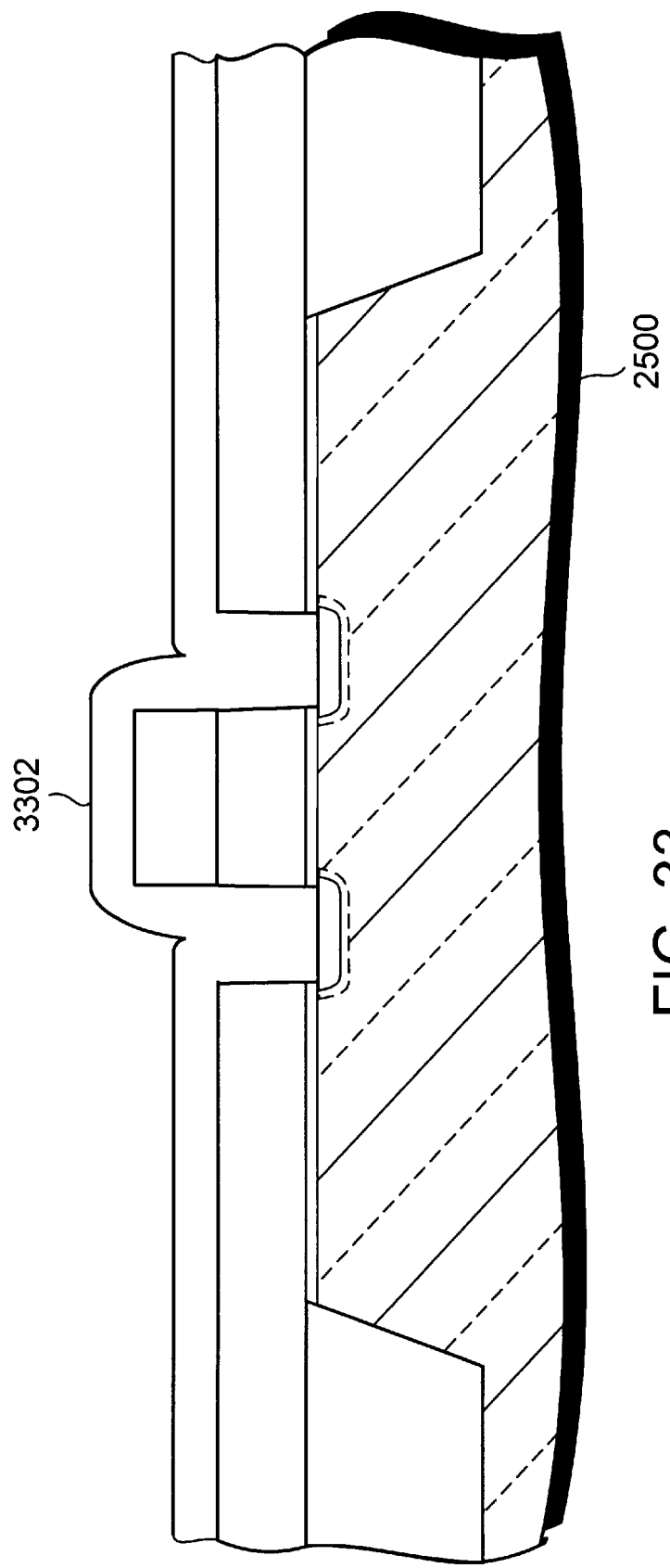

Thus, the next step 324 in method 2400 is to conformally deposit the sidewall spacer material. This material would suitable comprise any dielectric material, such as silicon dioxide or silicon nitride. Turning to FIG. 33, the wafer portion 2500 is illustrated with a conformal deposition of a sidewall spacer material layer 3302. In the preferred embodiment, the sidewall spacer material comprises silicon dioxide, but could also comprise any other suitable material. The sidewall spacer material layer 3302 fills the sidewall spacer troughs 2801 and 2802 as it is conformally deposits across the wafer.

The next step 326 is to directionally etch the sidewall spacer material to form sidewall spacers on the sides of the gate. This etch preferably is an over-etch, meaning that it continues even after all the side wall spacer material has been removed from the horizontal surfaces, removing a portion of the remaining hard mask which covers the gate. Preferably, the directional etch removes all or almost all the sidewall spacer material from the source and drain sides of the sidewall troughs, while leaving sidewall spacers on the gate sides of the sidewall spacer troughs. The etch is preferably done by an oxide reactive ion etch with $CHF_3$ and $O_2$, but any suitable oxide etch could be used.

This result is facilitated by the depth of the trough sidewalls on the gate sides being much deeper (i.e., the depth includes both the gate material and the hard mask material) then the depth of the trough sidewalls on the source and drain sides (i.e., including only the gate material). Because of this, a directional etch will remove all or most of the sidewall material from the source and drain sides of the sidewall troughs before removing it from the sides of the gate itself.

It should be noted that when the directional etch removes all the sidewall spacer material from atop the remaining hardmask, the remaining hardmask will be etched away. The depth of the hardmask should be enough to facilitate sufficient etching of the sidewall spacer material such that it is removed from the trough sidewalls on the source and drain sides without etching into the gate material itself.

Although it is generally preferably to remove all the sidewall spacer material from the source and drain sides of the sidewall troughs, the etch can be stopped with a small amount remaining, as long as a connection between the substrate and the raised source and drains can still be made.

It should be noted that care should be taken in this etch procedure to ensure that portions of the gate polysilicon under the hardmask are not inadvertently etched by this procedure. In particular, as the etch removes spacer material, eventually the side of the gate polysilicon under the hardmask will be exposed. The etch used to remove the sidewall spacer material could etch away the gate as well, damaging the gate structure. As discussed before, the preferred method for avoiding this issue involves forming a nitride liner in the sidewall spacer trough as part of step 322 as illustrated in FIG. 32. By performing this etch selective to nitride the preservation of the polysilicon gate material under the hardmask as well as the polysilicon source/drain material is assured.

Figure 34:
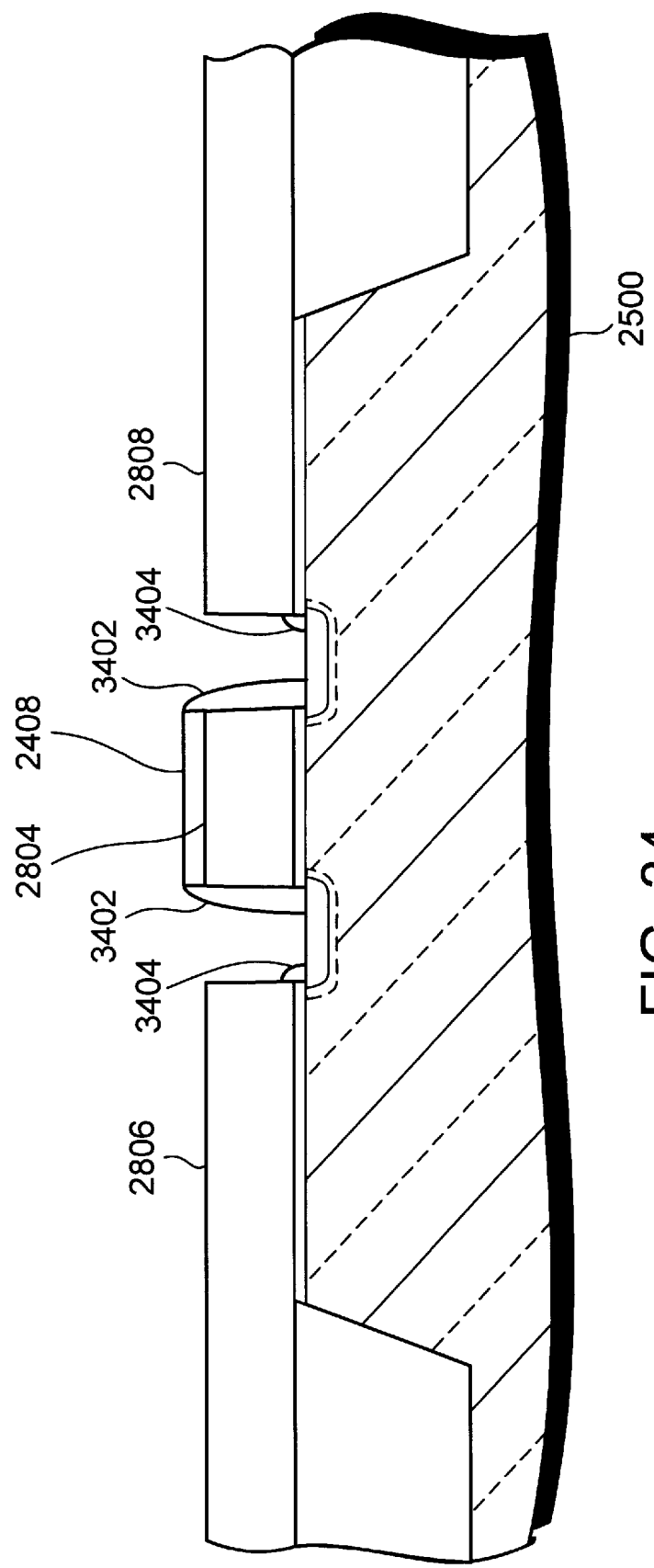

Turning to FIG. 34, the wafer portion 2500 is illustrated after the sidewall spacer material has been directionally etched to form sidewall spacers 3402 on the sides of the gate. The etch has also removed a portion of the hard mask 2408. Small portions of sidewall material 3404, called sidewall spacer stubs, have been left on the source and drain sides of the sidewall trough. As discussed above, this is acceptable as long as a conduction path can still be provided between the raised source/drains and the substrate.

The next step 328 is to selectively grow silicon on the wafer. The selective growing of silicon is preferably accomplished by growing silicon in an epitaxial chamber with a preferred thickness of 500 angstroms. This process causes silicon to be grown on all silicon or polysilicon surfaces. In particular, silicon grows on the exposed top and sides of the raised source region and raised drain regions of polysilicon. Additionally, the silicon grows on the drain-side substrate and the source-side substrate exposed through the sidewall troughs. Preferably the silicon growing on the source-side substrate and the raised source region sidewalls bridges to connect the substrate to the raised source region. Likewise, the silicon growing on the drain-side substrate and the raised drain region sidewalls preferably expands to connect the substrate to the raised drain region. It should be noted that the hardmask which covers the gate, and the sidewall spacers which cover the sidewalls of the gate prevent silicon from growing there. This prevents the gate from being shorted out and allows silicon to be grown until the substrate is connected to the source and drain region sidewalls.

Figure 35:
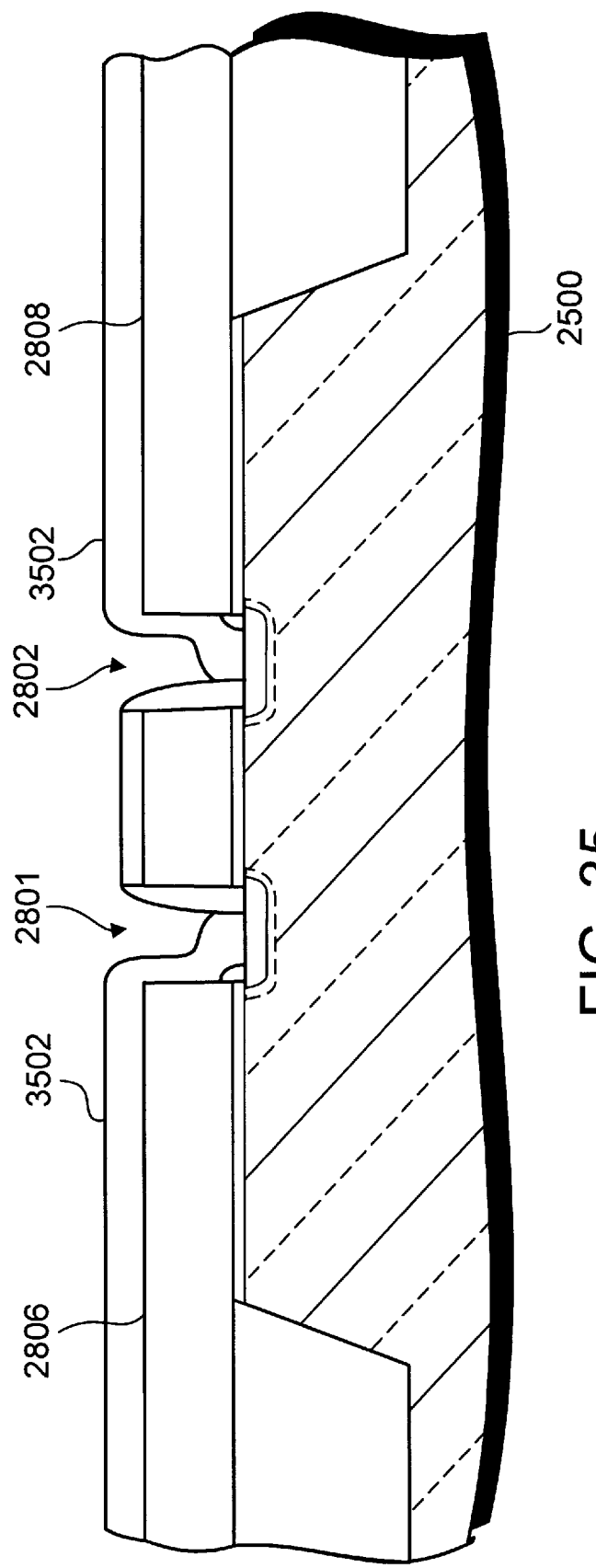

Turning to FIG. 35, the wafer portion 2500 is illustrated after silicon 3502 has been selectively grown on the wafer. The silicon 3502 has grown on all the silicon surfaces, including the raised source region 2806 and the raised drain region 2808, and the substrate 2500 exposed through troughs 2801 and 2802. In accordance with the preferred embodiment, the silicon has grown to the connect the source-side substrate exposed in trough 2801 to the raised source region 2806. Likewise, the silicon has grown to connect the drain-side substrate exposed in trough 2802 and the raised drain region 2808. It should be noted that the small portions of sidewall material 3404 are bridged by the growing silicon and thus are too small to interfere with the connection between the raised source and drain regions and the substrate.

The next step 330 of method 2400 is to pattern the grown silicon and polysilicon material to separate the various elements of adjacent field effect transistors. In particular, this patterning defines the areas of grown silicon and polysilicon that will make the various field effect devices. This patterning is preferably accomplished by depositing a layer of photoresist, patterning the photoresist, and then etching the silicon and polysilicon. This etching is preferably accomplished using a three step reactive ion etch to etch the entire source/drain stack in selected areas. The first step is to etch silicon, preferably with a $HBr/HCl/O_2$ chemistry that is selective to oxide and nitride. The second step is to etch nitride oxide layers, preferably done with a $CHF_3$ and $O_2$ chemistry that is selective to polysilicon. The final etch step is to etch polysilicon, preferably done with $HBr/HCl/O_2$ chemistry that is selective to oxide such that it will stop on the underlying STI or gate oxide.

Figure 36:
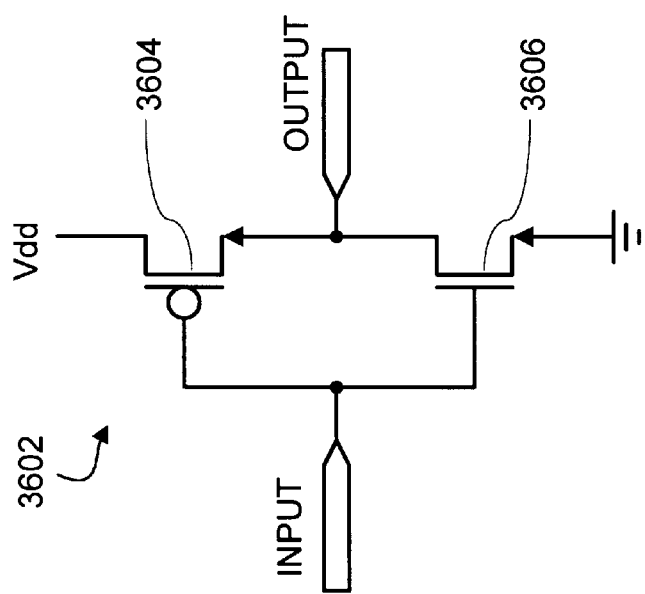
FIG. 36 is a circuit diagram of a CMOS inverter.

The design used to pattern the grown silicon and polysilicon material will depend greatly upon the particular circuit design being fabricated. For example, turning to FIG. 36, a typical CMOS inverter 3602 is illustrated. The CMOS inverter includes a p-channel FET 3604 and an n-channel FET 3606. The input of the CMOS inverter is connected to the gates of P-FET 3604 and N-FET 3606. The output of CMOS inverter 3602 is connected to the drain of P-FET 3604 and the source of N-FET 3606. The source of P-FET 3604 is connected to Vdd. The drain of N-FET 3606 is connected to ground.

Figure 37:
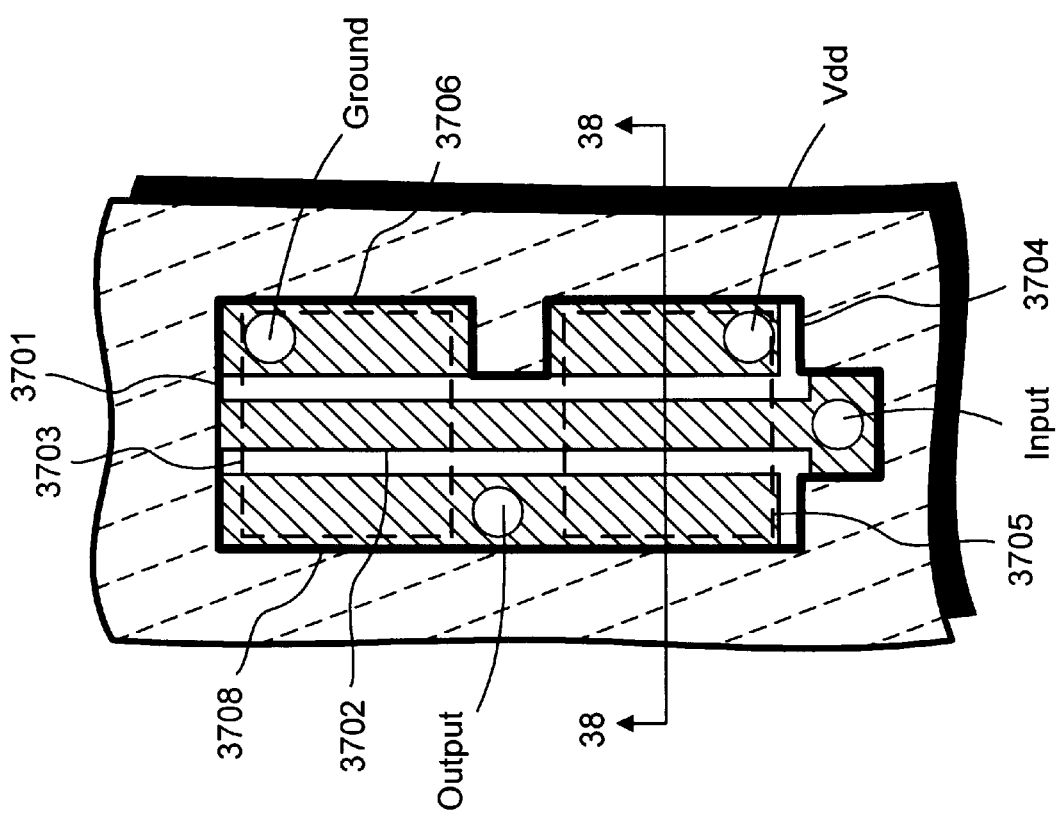
FIG. 37 is a top view of a CMOS inverter implemented on a wafer portion in accordance with the preferred embodiment.

Turning to FIG. 37, a top view of the wafer portion 2500 illustrates how the grown silicon and polysilicon material may be patterned to implement the CMOS inverter 3702. Dashed line 3703 shows the area of n-type diffusion on which the N-FET 3606 is formed, while dashed line 3705 shows the area of p-type diffusion on which the P-FET 3604 is formed. Areas outside of 3703 and 3705 comprise the shallow trench isolation, which can be much smaller due to increased resistance to leakage in the preferred embodiment transistors.

The dark line 3701 defines the exterior perimeter of the patterned grown silicon and polysilicon. The patterning breaks up the grown silicon and polysilicon into portions 3702, 3704, 3706 and 3708. Portion 3702 of polysilicon comprises the gate of P-FET 3604 and the gate of N-FET 3606, and are connected to the input of the CMOS inverter. Portion 3704 of grown silicon and polysilicon comprise the source of P-FET 3604 and is connected to Vdd. Portion 3706 of grown silicon and polysilicon comprise the drain of N-FET 3606 and is connected to ground. Portion 3708 of grown silicon and polysilicon comprise the drain of P-FET 3604 and the source of N-FET 3606 and is connected to the output.

It should be noted that the remaining raised source and drains are acting as local interconnects between adjacent transistors. Thus, by simply by not etching the gate conductor polysilicon between transistors, those transistors can be connected together. This is a effective way of connecting adjacent devices without requiring extra layers or additional processing steps It should be understood that this is just one example of how the grown silicon and polysilicon can be patterned in accordance with the preferred embodiment. For example, in another circuit where the drain of the P-FET 3604 and the source of the N-FET 3606 are not to be connected together, the patterning would further break up portion 3708 into separate portions for the P-FET 3604 drain the N-FET 3606 source.

Figure 38:
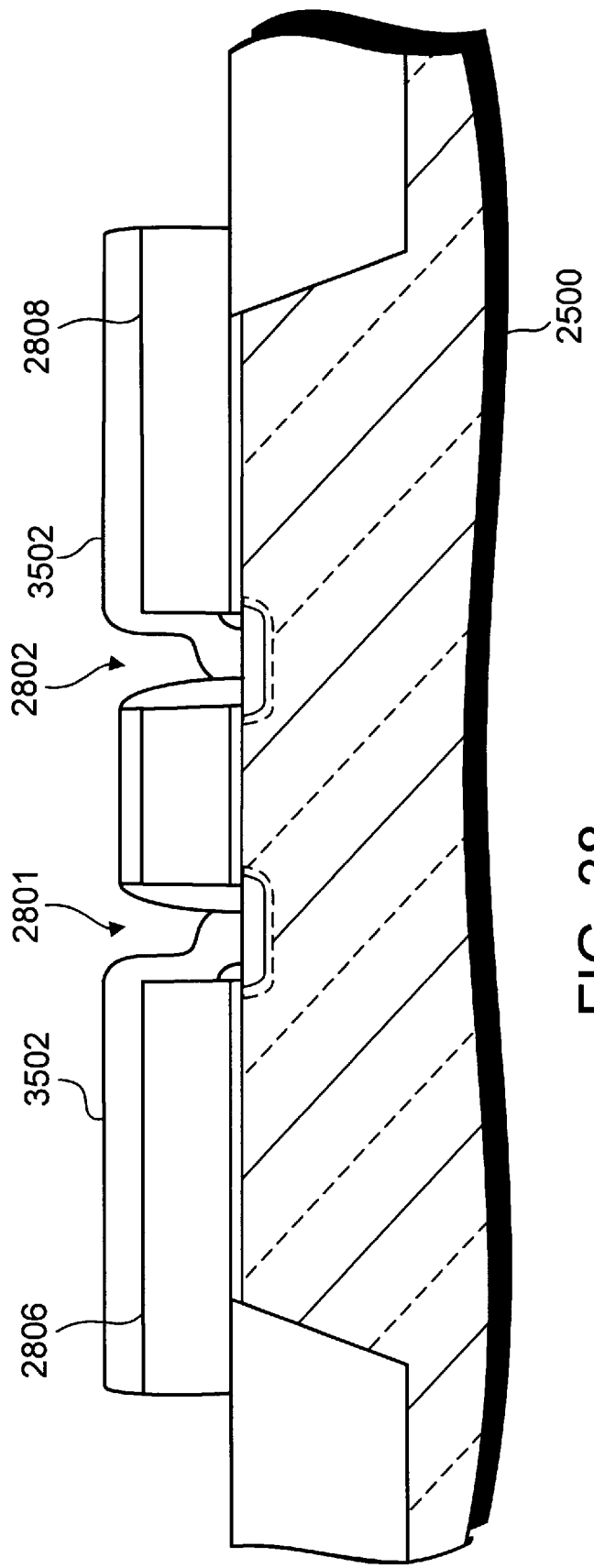
FIGS. 38–40 are cross-sectional side views of a wafer portion in fabrication in accordance with the preferred embodiment.

Turning to FIG. 38, the cross section of wafer portion 2500 (taken along line 38—38 in FIG. 37) is illustrated after the grown silicon and polysilicon has been etched between the source and drain regions of adjacent FETS.

The next step 332 is to remove the remaining hardmask. The hardmask is preferably removed using a hot phosphoric etch or using a reactive ion etch with a $CHF_3/O_2$ chemistry.

Figure 39:
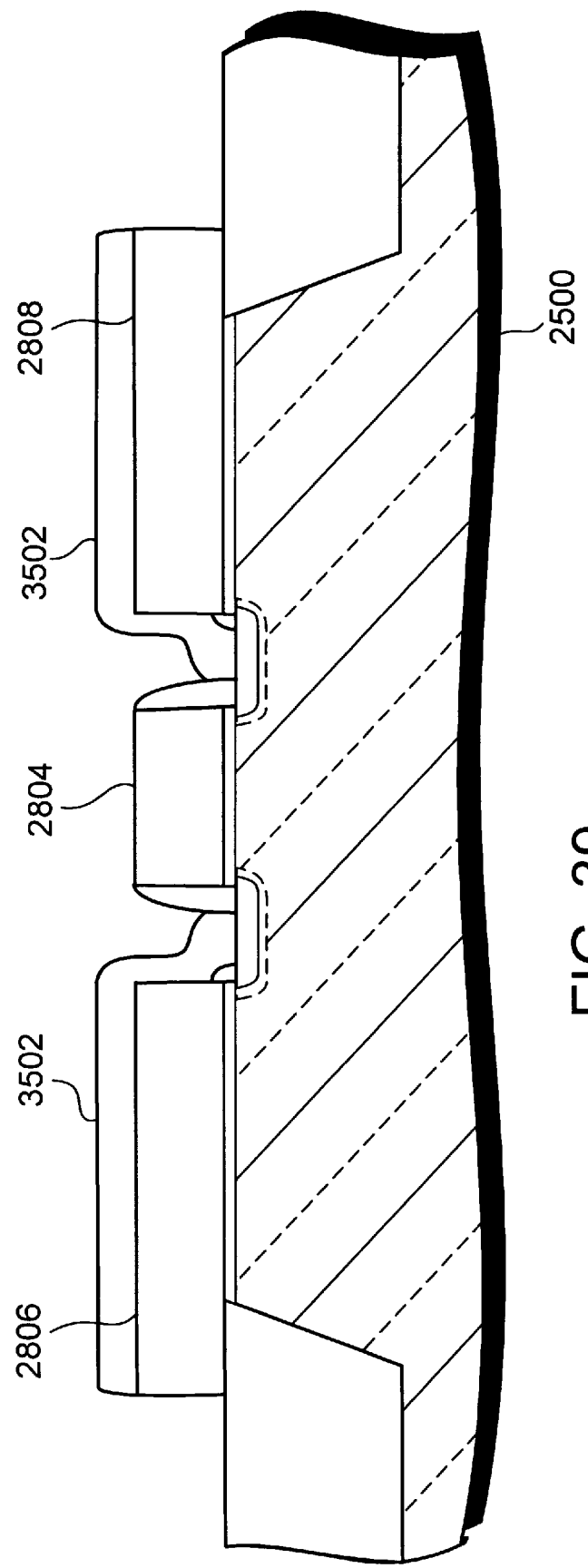

Turning to FIG. 39, the wafer portion 2500 is illustrated after the remaining hardmask has been removed and the gate polysilicon 2804 exposed. The etch used to remove the remaining hardmask also removes a portion of sidewall spacers adjacent to the hardmask.

The next step 334 is to implant the source and drain implants into the respective raised source and drain regions. This doping forms the device diffusions in the preferred embodiment. In prior art methods, with the source and drain formed in the substrate a number of complex implants are needed to minimize capacitance to the substrate and leakage. In the preferred embodiment method however, the leakage and capacitance is inherently reduced and the implants required are relatively straightforward. In particular, the preferred source and drain implants would be formed by implanting through the standard N-type and P-type source/drain masks. With this method, no additional spacer is needed to keep the N+ and P+ dopants away from the channel. Additionally the preferred embodiment also allows the N+ and P+ implants to be simplified since junction capacitance is no longer a concern. In the preferred embodiment, the polysilicon gate is doped at the same time as either the source or drain implants.

Figure 40:
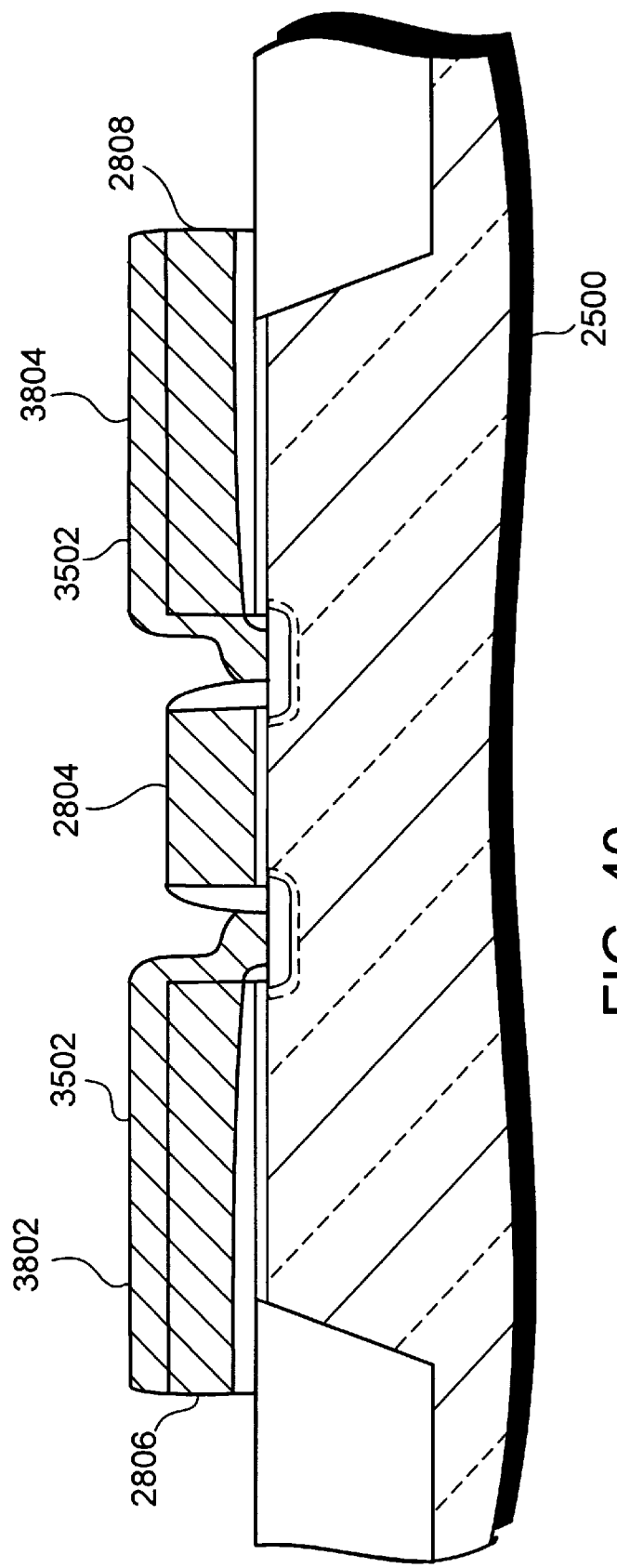

Turning to FIG. 40, the wafer portion 2500 is illustrated after the source 3802 and drain 3804 implants have been made in the raised source region 2806 and the raised drain region 2808 respectively. The gate 2804 is also preferably doped during this procedure. After the implants have been made, any needed device contacts to the gate, source and drain region can then be made.

Thus, the preferred embodiments capitalize on the unique properties of hybrid resist to form a field effect transistor with raised source and drain regions. The preferred embodiment transistor has reduced leakage problems and increased resistence to latch up. The preferred embodiments also has the advantage of reduced junction capacitance, larger circuit density due to the elimination of the latchup STI space as the limiting rule for adjacent devices, and the added density from the use of the use of the raised source/drains as a local interconnect.

While the invention has been particularly shown and described with reference to an exemplary embodiment using hybrid resist to form a field effect transistor with raised source and drain regions, those skilled in the art will recognize that the preferred embodiment can be applied to other applications where latch-up suppression and increased circuit density is desirable, and that various changes in form and details may be made therein without departing from the spirit and scope of the invention. For example, it will also be understood by those skilled in the art that the invention is applicable to different isolation technologies (e.g., LOCOS, recessed oxide (ROX), etc.), well and substrate technologies, dopant types, energies and species. It will also be understood that the spirit of the invention is applicable to other semiconductor technologies (e.g., BiCMOS, bipolar, silicon on insulator (SOI), silicon germanium (SiGe).

What is claimed is:

1. A method for forming a sidewall spacer on selected sidewalls of a substrate, the method comprising the steps of:
  a) depositing a layer of hybrid resist on said substrate;
  b) exposing said hybrid resist layer through a mask containing a plurality of shapes such that first portions of said hybrid resist are exposed to a first exposure level, second portions of said hybrid resist are exposed to a second exposure level, and third portions of said hybrid resist are exposed to a third exposure level, wherein said second exposure level results from diffraction effects at the edges of said plurality of shapes;
  c) developing said hybrid resist layer such that said second portions of said hybrid resist are removed, said removal of said second portions exposing a first region of said substrate;
  d) etching said first region of said substrate to form a sidewall spacer trough;
  e) removing said first portions of said hybrid resist and exposing a second region of said substrate while said third portions of hybrid resist remain covering a third region of said substrate;

f) depositing a sidewall spacer material in said sidewall spacer trough;

g) directionally etching said sidewall spacer material in said trough until said sidewall spacer material is removed from a sidewall of said second region of said substrate while said sidewall spacer material remains on a sidewall of said third region of said substrate.

2. The method of claim 1 wherein the step of removing said first portions of hybrid resist comprises the steps of:

i) blanket exposing said hybrid resist wafer such that said first portions of said hybrid resist are made soluble; and ii) developing away said first portions of said hybrid resist.

3. The method of claim 2 wherein the step of blanket exposing comprises an exposure at an intermediate exposure level.

4. The method of claim 1 wherein the step of removing said first portions of said hybrid resist comprises dissolving said first portions of said hybrid resist in a solvent that will not dissolve the third portions of said hybrid resist.

5. The method of claim 4 wherein the solvent is selected from the group consisting of:

n-butyl acetate and tetramethyl ammonium hydroxide.

6. The method of claim 1 wherein the first level of exposure comprises substantially no exposure, wherein said second level of exposure comprises an intermediate exposure, and wherein said third level of exposure comprises a full exposure.

7. The method of claim 6 wherein the first level of exposure leaves said first portion of hybrid resist photoactive, wherein said second level of exposure makes said second portion of hybrid resist soluble in developer and wherein said third level of exposure cross links said third portion of said hybrid resist making it insoluble in developer and no longer photoactive.

8. The method of claim 1 further comprising the step of providing a hardmask on said substrate, wherein the step of depositing hybrid resist comprises depositing hybrid resist on said hardmask, and wherein the steps of etching said sidewall spacer trough and removing said first portions of said hybrid resist comprises etching said hardmask, removing said first portions of said hybrid resist, and etching said substrate selective to said third portions of hybrid resist and said hardmask.

9. The method of claim 8 wherein said hard mask comprises a nitride.

10. The method of claim 8 wherein said hard mask layer has a thickness less than 2000 angstroms.

11. The method of claim 1 wherein the step of depositing sidewall spacer material comprises forming a sidewall oxide layer in said trough, forming a nitride layer over said sidewall oxide layer, and filling said sidewall spacer trough with a deposition of oxide over said nitride layer.

12. The method of claim 1 further comprising the steps of forming an implant through said sidewall spacer troughs into said substrate.

13. The method of claim 1 wherein said semiconductor substrate comprises a transistor gate material layer on a silicon wafer, wherein said sidewall spacer troughs are etched through said gate material layer, and wherein said third region of said semiconductor substrate comprises a gate for a transistor.

14. The method of claim 13 wherein said transistor gate material comprises polysilicon.

15. The method of claim 14 further comprising the step of forming a gate edge implant through said sidewall spacer trough.

16. The method of claim 15 wherein said forming a gate edge implant comprises forming a lightly doped gate edge implant and forming a halo implant deeper than said lightly doped implant.

17. A method for forming a sidewall spacer on a substrate, the method comprising the steps of:

a) forming a hardmask on said substrate;

b) depositing a layer of hybrid resist on said hardmask;

c) exposing said hybrid resist layer through a mask containing a plurality of shapes such that first portions of said hybrid resist are exposed to substantially no exposure and remain photoactive, second portions of said hybrid resist are exposed to an intermediate exposure and become soluble in developer, and third portions of said hybrid resist are fully exposed and become insoluble in developer, wherein said second exposure level results from diffraction effects at the edges of said plurality of shapes;

d) developing said hybrid resist layer such that said second portions of said hybrid resist are removed, said removal exposing a first region of said hardmask;

e) removing said first region of said hardmask, said removal of said first region of said hard mask exposing a first region of said substrate;

f) blanket exposing said hybrid resist layer to an intermediate exposure such that said first portions of said hybrid resist become soluble in developer;

g) developing said hybrid resist layer such that said first portions are removed, said removal exposing a second region of said hardmask;

h) etching said first region of said substrate selective to said hardmask and said third portion of said hybrid resist, said etching of said first region of said substrate forming a sidewall spacer trough in said substrate;

i) removing said exposed second region of said hardmask, said removal exposing a second region of said substrate;

j) removing said third portion of said hybrid resist, exposing a third region of said hardmask, said third region of said hardmask covering a third region of said substrate;

k) filling said sidewall spacer trough with a sidewall spacer material;

m) directionally etching said sidewall spacer material in said sidewall spacer trough until said sidewall spacer material is removed from a sidewall of said second region of said substrate while said sidewall spacer material remains on a sidewall of said third region of said substrate.

18. The method of claim 17 wherein the step of depositing sidewall spacer material in sidewall spacer trough comprises forming a sidewall oxide layer in said trough, forming a nitride layer over said sidewall oxide layer, and filling said sidewall spacer trough with a deposition of oxide over said nitride layer.

19. The method of claim 17 wherein said substrate comprises gate material such that said third region of said substrate comprises a gate.

20. The method of claim 19 wherein said gate material comprises polysilicon.

* * * * *